United States Patent
Yu et al.

(10) Patent No.: US 11,251,119 B2
(45) Date of Patent: Feb. 15, 2022

(54) PACKAGE STRUCTURE, PACKAGE-ON-PACKAGE STRUCTURE AND METHOD OF FABRICATING THE SAME

(71) Applicant: Taiwan Semiconductor Manufacturing Co., Ltd., Hsinchu (TW)

(72) Inventors: Tsung-Yuan Yu, Taipei (TW); Cheng-Chieh Hsieh, Tainan (TW); Hung-Yi Kuo, Taipei (TW); Hao-Yi Tsai, Hsinchu (TW); Ming-Hung Tseng, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/748,744

(22) Filed: Jan. 21, 2020

(65) Prior Publication Data
US 2021/0090993 A1    Mar. 25, 2021

Related U.S. Application Data

(60) Provisional application No. 62/905,392, filed on Sep. 25, 2019.

(51) Int. Cl.
| | |
|---|---|
| *H01L 23/522* | (2006.01) |
| *H01L 23/31* | (2006.01) |
| *H01L 21/56* | (2006.01) |
| *H01L 21/768* | (2006.01) |
| *H01L 25/065* | (2006.01) |

(52) U.S. Cl.
CPC .......... *H01L 23/5226* (2013.01); *H01L 21/56* (2013.01); *H01L 21/76804* (2013.01); *H01L 23/3121* (2013.01); *H01L 25/0657* (2013.01)

(58) Field of Classification Search
CPC . H01L 23/5226; H01L 23/3121; H01L 21/56; H01L 21/76804; H01L 25/0657
See application file for complete search history.

(56) References Cited

U.S. PATENT DOCUMENTS

| | | | |
|---|---|---|---|
| 8,143,710 B2 * | 3/2012 | Cho .................. | H01L 25/18 257/686 |
| 9,000,584 B2 | 4/2015 | Lin et al. | |
| 9,048,222 B2 | 6/2015 | Hung et al. | |

(Continued)

*Primary Examiner* — Nicholas J Tobergte
(74) *Attorney, Agent, or Firm* — JCIPRNET

(57) ABSTRACT

A package structure includes a first semiconductor die, an insulating encapsulant, a plurality of first through insulator vias, a plurality of second through insulator vias, and a redistribution layer. The insulating encapsulant is encapsulating the first semiconductor die. The first through insulator vias are located in a central area of the insulating encapsulant surrounding the first semiconductor die. The second through insulator vias are located in a peripheral area of the insulating encapsulant surrounding the plurality of first through insulator vias located in the central area, wherein an aspect ratio of the plurality of second through insulator vias is greater than an aspect ratio of the plurality of first through insulator vias. The redistribution layer is disposed on the insulating encapsulant and electrically connected to the first semiconductor die, the plurality of first through insulator vias and the plurality of second through insulator vias.

20 Claims, 25 Drawing Sheets

(56) References Cited

U.S. PATENT DOCUMENTS

| | | | |
|---|---|---|---|
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,401 B2* | 6/2016 | Teh | H01L 24/82 |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,812,337 B2* | 11/2017 | Chen | H01L 23/498 |
| 10,109,541 B2* | 10/2018 | Baek | H01L 23/5389 |
| 10,629,476 B2* | 4/2020 | Chen | H01L 24/24 |
| 10,672,741 B2* | 6/2020 | Yu | H01L 24/97 |
| 2013/0001795 A1* | 1/2013 | Lim | H01L 24/05 |
| | | | 257/774 |

* cited by examiner

PACKAGE STRUCTURE, PACKAGE-ON-PACKAGE STRUCTURE AND METHOD OF FABRICATING THE SAME

CROSS-REFERENCE TO RELATED APPLICATION

This application claims the priority benefit of U.S. provisional application Ser. No. 62/905,392, filed on Sep. 25, 2019. The entirety of the above-mentioned patent application is hereby incorporated by reference herein and made a part of this specification.

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Developments of the three-dimensional integration technology for wafer level packaging are underway to satisfy the demands of size reduction, high performance interconnects and heterogeneous integration for high-density integration packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
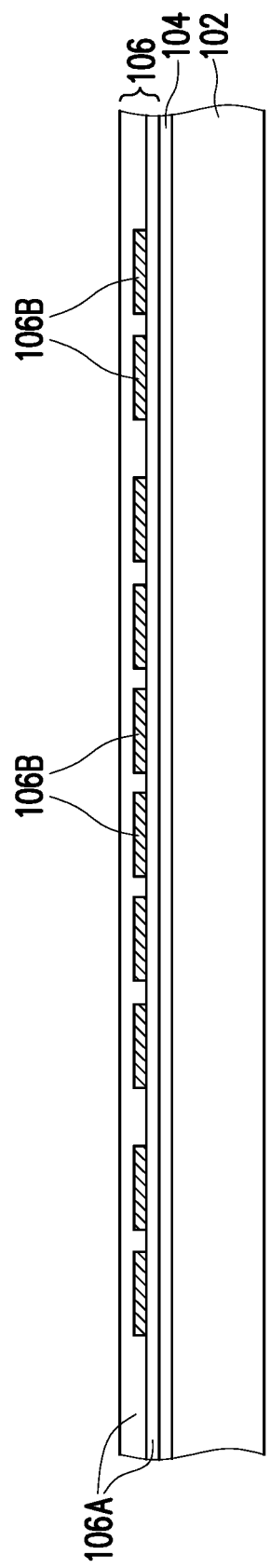
FIG. 1A to FIG. 1L are schematic sectional views of various stages in a method of fabricating a package-on-package (PoP) structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1L are schematic sectional views of various stages in a method of fabricating a package-on-package (PoP) structure according to some exemplary embodiments of the present disclosure. Referring to FIG. 1A, a carrier 102 is provided. In some embodiments, the carrier 102 may be a glass carrier or any suitable carrier for carrying a semiconductor wafer or a reconstituted wafer for the manufacturing method of the package structure. In some embodiments, the carrier 102 is coated with a debond layer 104. The material of the debond layer 104 may be any material suitable for bonding and de-bonding the carrier 102 from the above layer(s) or any wafer(s) disposed thereon.

In some embodiments, the debond layer 104 may include a dielectric material layer made of a dielectric material including any suitable polymer-based dielectric material (such as benzocyclobutene ("BCB"), polybenzoxazole ("PBO")). In an alternative embodiment, the debond layer 104 may include a dielectric material layer made of an epoxy-based thermal-release material, which loses its adhesive property when heated, such as a light-to-heat-conversion (LTHC) release coating film. In a further alternative embodiment, the debond layer 104 may include a dielectric material layer made of an ultra-violet (UV) glue, which loses its adhesive property when exposed to UV lights. In certain embodiments, the debond layer 104 may be dispensed as a liquid and cured, or may be a laminate film laminated onto the carrier 102, or may be the like. The top surface of the debond layer 104, which is opposite to a bottom surface contacting the carrier 102, may be leveled and may have a high degree of coplanarity. In certain embodiments, the debond layer 104 is, for example, a LTHC layer with good chemical resistance, and such layer enables room temperature de-bonding from the carrier 102 by applying laser irradiation, however the disclosure is not limited thereto.

In an alternative embodiment, a buffer layer (not shown) may be coated on the debond layer 104, where the debond layer 104 is sandwiched between the buffer layer and the carrier 102, and the top surface of the buffer layer may further provide a high degree of coplanarity. In some embodiments, the buffer layer may be a dielectric material layer. In some embodiments, the buffer layer may be a polymer layer which made of polyimide, PBO, BCB, or any other suitable polymer-based dielectric material. In some embodiments, the buffer layer may be Ajinomoto Buildup Film (ABF), Solder Resist film (SR), or the like. In other words, the buffer layer is optional and may be omitted based on the demand, so that the disclosure is not limited thereto.

As illustrated in FIG. 1A, a redistribution layer 106 is formed over the carrier 102. For example, the redistribution layer 106 is formed on the debond layer 104, and the formation of the redistribution layer 106 includes sequentially forming one or more dielectric layers 106A and one or more conductive layers 106B in alternation. In some embodiments, the redistribution layer 106 includes two dielectric layers 106A and one conductive layer 106B as shown in FIG. 1A, where the conductive layer 106B is sandwiched between the dielectric layers 106A. However, the disclosure is not limited thereto. The numbers of the dielectric layers 106A and the conductive layer 106B included in the redistribution layer 106 is not limited thereto, and may be designated and selected based on the demand. For example, the numbers of the dielectric layers 106A and the conductive layers 106B may be one or more than one.

In certain embodiments, the material of the dielectric layers 106A may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers 106A may be formed by suitable fabrication techniques such as spin-on coating, chemical vapor deposition (CVD), plasma-enhanced chemical vapor deposition (PECVD) or the like. The disclosure is not limited thereto.

In some embodiments, the material of the conductive layer 106B may be made of conductive materials formed by electroplating or deposition, such as aluminum, titanium, copper, nickel, tungsten, and/or alloys thereof, which may be patterned using a photolithography and etching process. In some embodiments, the conductive layer 106B may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 1B:
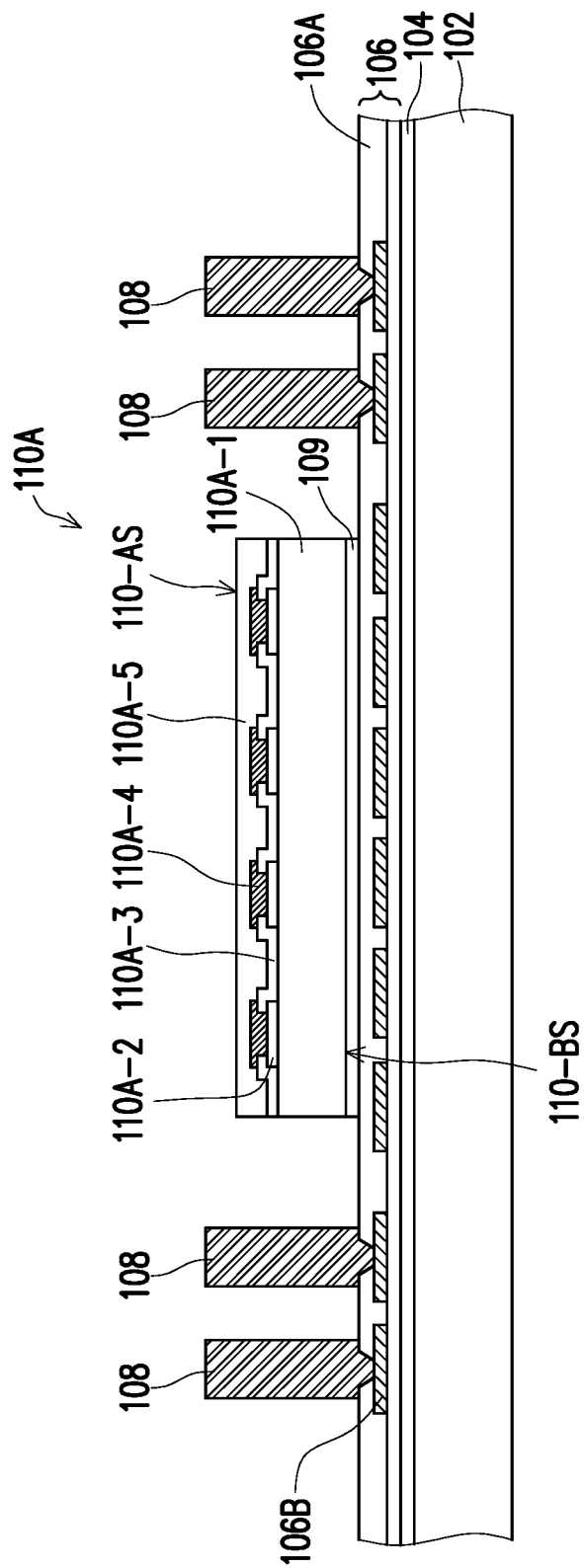

Referring to FIG. 1B, after forming the redistribution layer 106, at least one semiconductor die 110A (second semiconductor die or bottom semiconductor die), and a plurality of connecting vias 108 are provided on the redistribution layer 106 and over the carrier 102. In some embodiments, the formation of the connecting vias 108 includes forming a mask pattern (not shown) with openings, then forming a metallic material (not shown) filling up the openings by electroplating or deposition, and removing the mask pattern to form the connecting vias 108 on the redistribution layer 106. In certain embodiments, the connecting vias 108 fills into a via opening that reveals the conductive layer 106B of the redistribution layer 106, so that the connecting vias 108 may be electrically connected to the redistribution layer 106. In some embodiments, the material of the mask pattern may include a positive photo-resist or a negative photo-resist. In one embodiment, the material of the connecting vias 108 may include a metal material such as copper or copper alloys, or the like. However, the disclosure is not limited thereto.

In an alternative embodiment, the connecting vias 108 may be formed by forming a seed layer (not shown) on the redistribution layer 106; forming the mask pattern with openings exposing portions of the seed layer; forming the metallic material on the exposed portions of the seed layer to form the connecting vias 108 by plating; removing the mask pattern; and then removing portions of the seed layer exposed by the connecting vias 108. For example, the seed layer may be a titanium/copper composited layer. For simplification, only four connecting vias 108 are illustrated in FIG. 1B. However, it should be noted that the number of connecting vias 108 is not limited thereto, and can be selected based on requirement.

Furthermore, in some embodiments, at least one semiconductor die 110A (second semiconductor die or bottom semiconductor die) is picked and placed on the redistribution layer 106. In some embodiments, the semiconductor die 110A has an active surface 110-AS, and a backside surface 110-BS opposite to the active surface 110-AS. For example, the backside surface 110-BS of the semiconductor die 110A may be attached to the redistribution layer 106 through a die attach film 109. By using the die attach film 109, a better adhesion between the semiconductor die 110A and the redistribution layer 106 is ensured. In the exemplary embodiment, only one semiconductor die 110A is illustrated. However, the disclosure is not limited thereto. It should be noted that the number of semiconductor dies 110A disposed on the redistribution layer 106 may be adjusted based on product requirement.

In the exemplary embodiment, the semiconductor die 110A includes a semiconductor substrate 110A-1, a plurality of conductive pads 110A-2, a passivation layer 110A-3, a plurality of conductive posts 110A-4, and a protection layer 110A-5. As illustrated in FIG. 1B, the plurality of conductive pads 110A-2 is disposed on the semiconductor substrate 110A-1. The passivation layer 110A-3 is formed over the semiconductor substrate 110A-1 and has openings that partially expose the conductive pads 110A-2 on the semiconductor substrate 110A-1. The semiconductor substrate 110A-1 may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 110A-2 may be aluminum pads, copper pads or other suitable metal pads. The passivation layer 110A-3 may be a silicon oxide layer, a silicon nitride layer, a silicon oxy-nitride layer or a dielectric layer formed of any suitable dielectric materials. Furthermore, in some embodiments, a post-passivation layer (not shown) is optionally formed over the passivation layer 110A-3. The post-passivation layer covers the passivation layer 110A-3 and has a plurality of contact openings. The conductive pads 110A-2 are partially exposed by the contact openings of the post passivation layer. The post-passivation layer may be a benzocyclobutene (BCB) layer, a polyimide layer, a polybenzoxazole (PBO) layer, or a dielectric layer formed by other suitable polymers. In some embodiments, the conductive posts 110A-4 are formed on the conductive pads 110A-2 by plating. In some embodiments, the protection layer 110A-5 is formed on the passivation layer 110A-3 or on the post passivation layer, and covering the conductive posts 110A-4 so as to protect the conductive posts 110A-4.

In some embodiments, when more than one semiconductor dies 110A are placed on the redistribution layer 106, the semiconductor dies 110A may be arranged in an array, and when the semiconductor dies 110A are arranged in an array, the connecting vias 108 may be classified into groups. The number of the semiconductor dies 110A may correspond to the number of the groups of the connecting vias 108. In the illustrated embodiment, the semiconductor die 110A may be picked and placed on the redistribution layer 106 after the formation of the connecting vias 108. However, the disclosure is not limited thereto. In some alternative embodiments, the semiconductor die 110A may be picked and placed on the redistribution layer before the formation of the connecting vias 108.

In some embodiments, the semiconductor die 110A may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto.

Figure 1C:
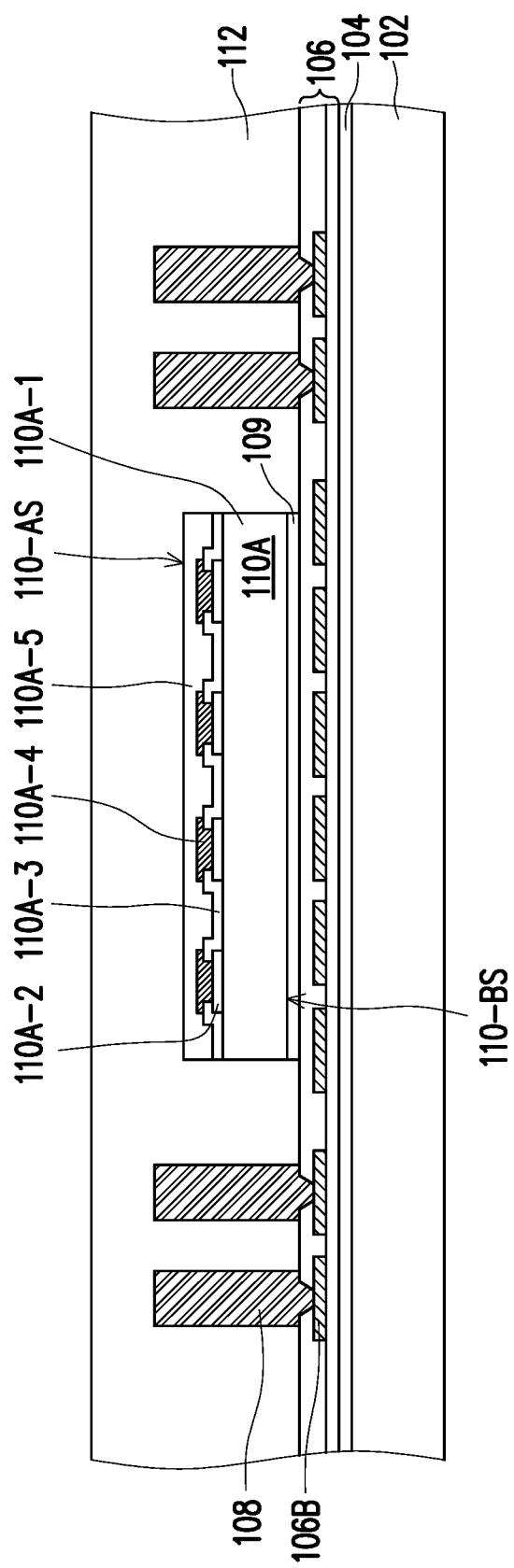

Referring to FIG. 1C, in a next step, an insulating material 112 is formed on the redistribution layer 106 and over the semiconductor die 110A. In some embodiments, the insulating material 112 is formed through, for example, a compression molding process, filling up the gaps between the semiconductor die 110A and the connecting vias 108 to encapsulate the semiconductor die 110A. The insulating material 112 also fills up the gaps between adjacent connecting vias 108 to encapsulate the connecting vias 108. At this stage, the conductive posts 110A-4 and the protection layer 110A-5 of the semiconductor die 110A are encapsulated by and well protected by the insulating material 112. In other words, the conductive posts 110A-4 and the protection layer 110A-5 of the semiconductor die 110A are not revealed and are well protected by the insulating material 112.

In some embodiments, the insulating material 112 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 112 may include an acceptable insulating encapsulation material. In some embodiments, the insulating material 112 may further include inorganic filler or inorganic compound (e.g. silica, clay, and so on) which can be added therein to optimize coefficient of thermal expansion (CTE) of the insulating material 112. The disclosure is not limited thereto.

Figure 1D:
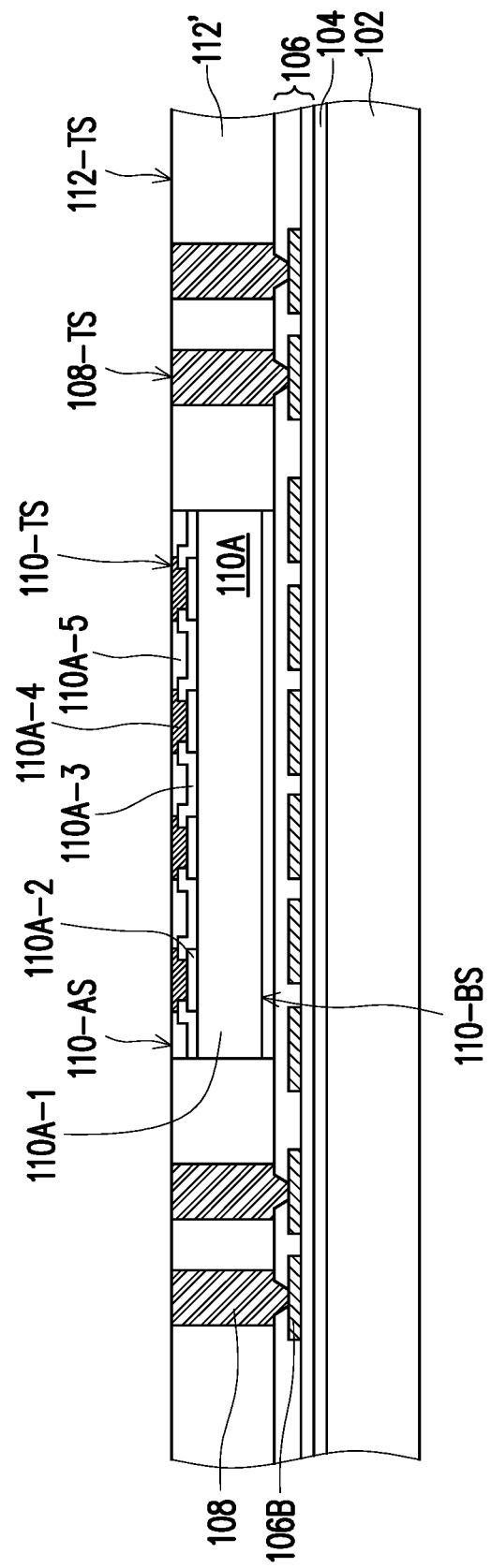

Referring to FIG. 1D, in a next step, the insulating material 112 is partially removed to expose the conductive posts 110A-4 and the connecting vias 108. In some embodiments, the insulating material 112 and the protection layer 110A-5 are ground or polished by a planarization step. For example, the planarization step is performed through a mechanical grinding process and/or a chemical mechanical polishing (CMP) process until the top surfaces 110-TS of the conductive posts 110A-4 are revealed. In some embodiments, the connecting vias 108 may be partially polished so that the top surfaces 108-TS of the connecting vias 108 are leveled with the top surfaces 110-TS of the conductive posts 110A-4, or leveled with the active surface 110-AS of the semiconductor die 110A. In other words, the conductive posts 110A-4 and the connecting vias 108 may also be slightly grinded/polished.

In the illustrated embodiment, the insulating material 112 is polished to form an insulating encapsulant 112' (second insulating encapsulant or bottom insulating encapsulant). In some embodiments, the top surface 112-TS of the insulating encapsulant 112', the top surface 108-TS of the connecting vias 108, the top surface 110-TS of the conductive posts 110A-4, and the top surface of the polished protection layer 110A-5 are coplanar and leveled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 1E:
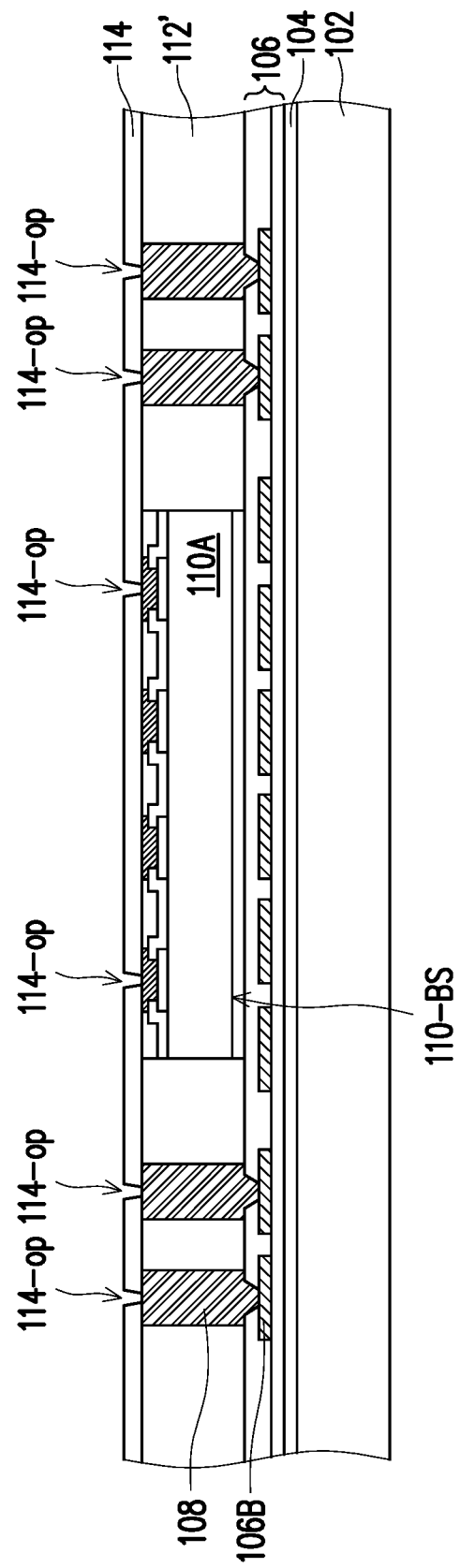

Referring to FIG. 1E, after the planarization step, a dielectric layer 114 is formed on the insulating encapsulant 112', the connecting vias 108 and over the semiconductor die 110A. In some embodiments, the dielectric layer 114 is patterned to form openings 114-op that reveal the connecting vias 108 and the conductive posts 110A-4.

Figure 1F:
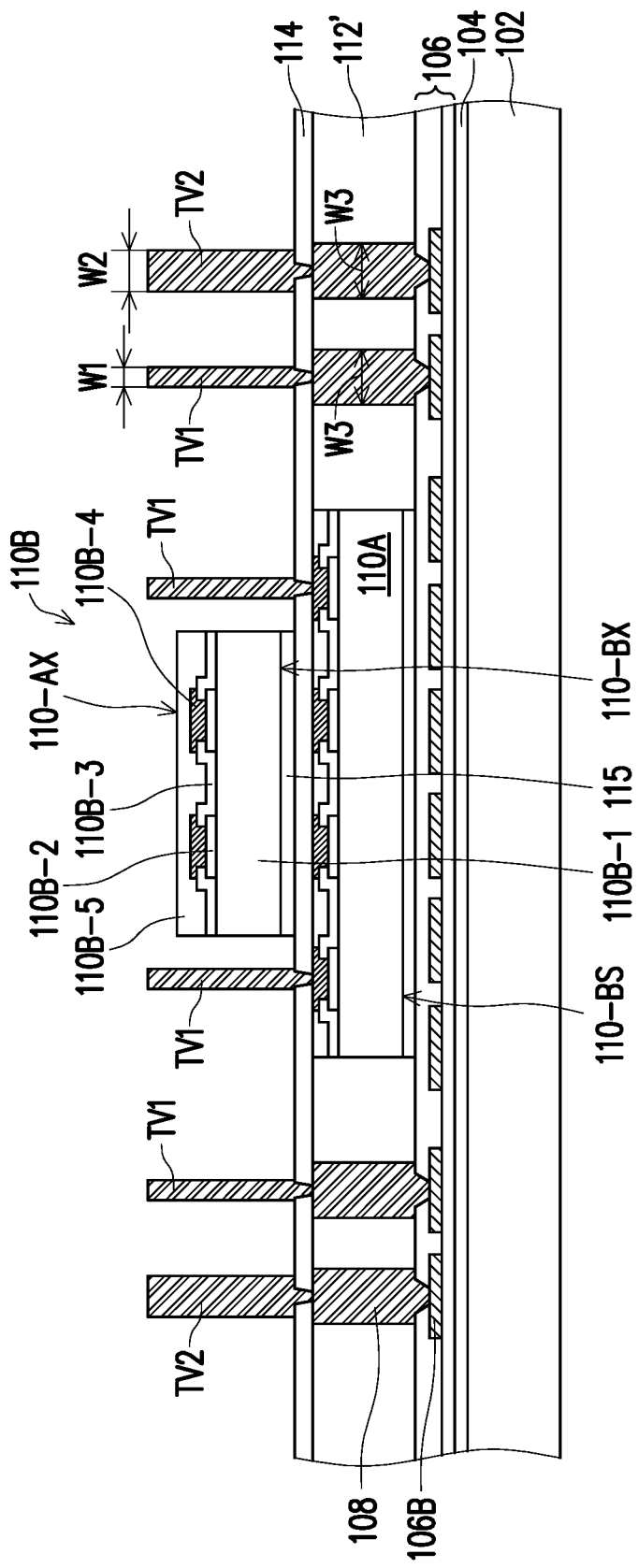

Referring to FIG. 1F, in a next step, at least one semiconductor die 110B (first semiconductor die or top semiconductor die), a plurality of first through insulator vias TV1 and a plurality of second through insulator vias TV2 are provided on the dielectric layer 114. In some embodiments, the first through insulator vias TV1 and the second through insulator vias TV2 fill into the openings 114-op of the dielectric layer 114 to be electrically connected to the connecting vias 108 and the conductive posts 110A-4. In some embodiments, the first through insulator vias TV1 and the second through insulator vias TV2 are formed in the same process. In certain embodiments, the first through insulator vias TV1 and the second through insulator vias TV2 are formed by a process similar to that of the connecting vias 108, hence, its detailed description will be omitted herein. In one embodiment, the materials of the first through insulator vias TV1 and the second through insulator vias TV2 may include a metal material such as copper or copper alloys, or the like. However, the disclosure is not limited thereto.

In the exemplary embodiment, an aspect ratio of the second through insulator vias TV2 is greater than an aspect ratio of the first through insulator vias TV1. Furthermore, in some embodiments, a size of the first through insulator vias TV1 is greater than a size of the second through insulator vias TV2. In certain embodiments, a shape (from a top view) of the first through insulator vias TV1 is different than a shape (from a top view) of the second through insulator vias TV2. In some embodiments, the first through insulator vias TV has a width of W1, the second through insulator vias TV2 has a width of W2, and the connecting vias 108 has a width of W3, wherein W1<W2≤W3. In other words, a size of the connecting vias 108 may be greater than a size of the first through insulator vias TV1 and the second through insulator vias TV2.

Furthermore, in some embodiments, at least one semiconductor die 110B (first semiconductor die or top semiconductor die) is picked and placed on the dielectric layer 114. In some embodiments, the semiconductor die 110B is placed on the dielectric layer 114 at positions overlapping with the semiconductor die 110A. In some embodiments, a size or dimensions of the semiconductor die 110B is smaller than a size or dimensions of the semiconductor die 110A, the disclosure is not limited thereto. In some embodiments, the semiconductor die 110B has an active surface 110-AX, and a backside surface 110-BX opposite to the active surface 110-AX. For example, the backside surface 110-BX of the semiconductor die 110B may be attached to the dielectric layer 114 through a die attach film 115. By using the die attach film 115, a better adhesion between the semiconductor die 110B and the dielectric layer 114 is ensured. In the exemplary embodiment, only one semiconductor die 110B is illustrated. However, the disclosure is not limited thereto. It should be noted that the number of semiconductor dies 110B disposed on the dielectric layer 114 may be adjusted based on product requirement.

In the exemplary embodiment, the semiconductor die 110B includes a semiconductor substrate 110B-1, a plurality of conductive pads 110B-2, a passivation layer 110B-3, a plurality of conductive posts 110B-4, and a protection layer 110B-5. As illustrated in FIG. 1F, the plurality of conductive pads 110B-2 is disposed on the semiconductor substrate 110B-1. The passivation layer 110B-3 is formed over the semiconductor substrate 110B-1 and has openings that partially expose the conductive pads 110B-2 on the semiconductor substrate 110B-1. The semiconductor substrate 110B-1 may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 110B-2 may be aluminum pads, copper pads or other suitable metal pads. The passivation layer 110B-3 may be a silicon oxide layer, a silicon nitride layer, a silicon oxy-nitride layer or a dielectric layer formed of any suitable dielectric materials. Furthermore, in some embodiments, a post-passivation layer (not shown) is optionally formed over the passivation layer 110B-3. The post-passivation layer covers the passivation layer 110B-3 and has a plurality of contact openings. The conductive pads 110B-2 are partially exposed by the contact openings of the post passivation layer. The post-passivation layer may be a benzocyclobutene (BCB) layer, a polyimide layer, a polybenzoxazole (PBO) layer, or a dielectric layer formed by other suitable polymers. In some embodiments, the conductive posts 110B-4 are formed on the conductive pads 110B-2 by plating. In some embodiments, the protection layer 110B-5 is formed on the passivation layer 110B-3 or on the post passivation layer, and covering the conductive posts 110B-4 so as to protect the conductive posts 110B-4.

In some embodiments, when more than one semiconductor dies 110B are placed on the dielectric layer 114, the semiconductor dies 110B may be arranged in an array, and when the semiconductor dies 110B are arranged in an array, the first through insulator vias TV1 and the second through insulator vias TV2 may be classified into groups. The number of the semiconductor dies 110B may correspond to the number of the groups of the first through insulator vias TV1 and the second through insulator vias TV2. In the illustrated embodiment, the semiconductor die 110B may be picked and placed on the dielectric layer 114 after the formation of the first and second through insulator vias (TV1/TV2). However, the disclosure is not limited thereto. In some alternative embodiments, the semiconductor die 110B may be picked and placed on the dielectric layer 114 before the formation of the first and second through insulator vias (TV1/TV2).

In some embodiments, the semiconductor die 110B may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto.

Figure 1G:
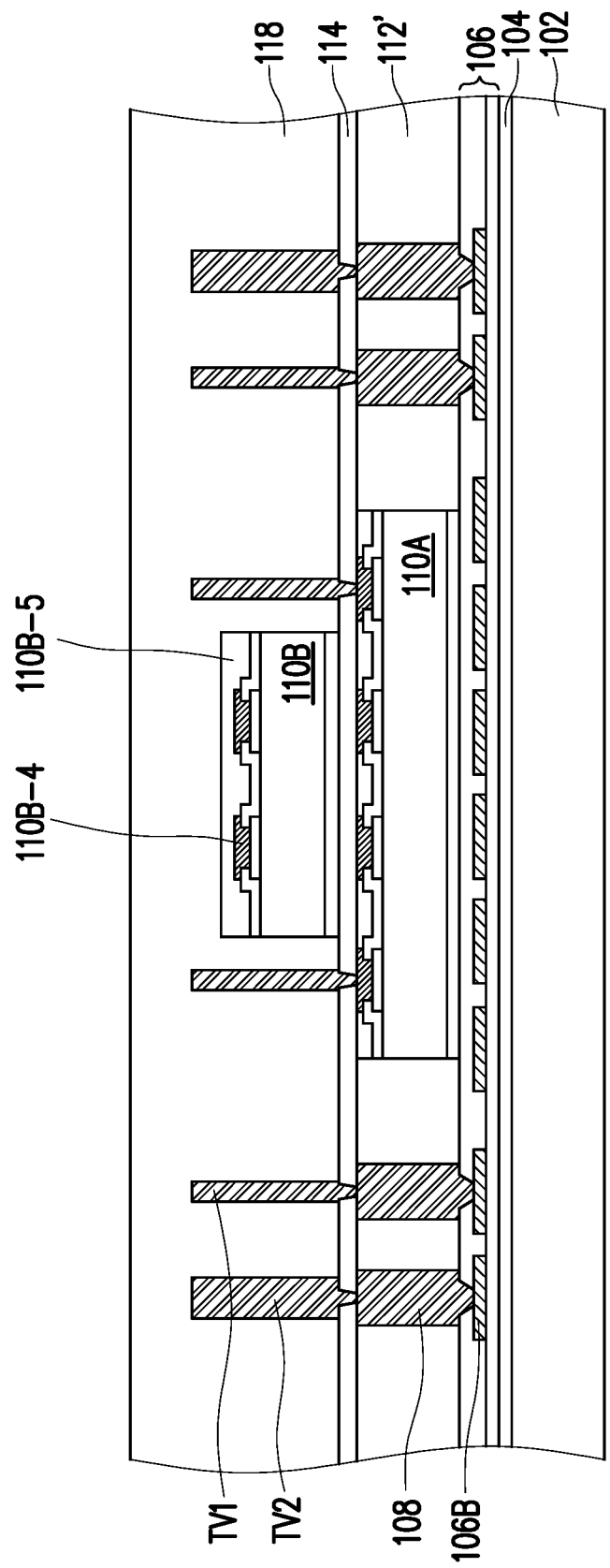

Referring to FIG. 1G, in a next step, an insulating material 118 is formed on the dielectric layer 114 and over the semiconductor die 110B. In some embodiments, the insulating material 118 is formed through, for example, a compression molding process, filling up the gaps between the semiconductor die 110B and the first and second through insulator vias (TV1/TV2) to encapsulate the semiconductor die 110B. The insulating material 118 also fills up the gaps between adjacent first and second through insulator vias (TV1/TV2) to encapsulate the first and second through insulator vias (TV1/TV2). At this stage, the conductive posts 110B-4 and the protection layer 110B-5 of the semiconductor die 110B are encapsulated by and well protected by the insulating material 118. In other words, the conductive posts 110B-4 and the protection layer 110B-5 of the semiconductor die 110B are not revealed and are well protected by the insulating material 118.

In some embodiments, the insulating material 118 may be selected from materials similar to the insulating material 112, but the disclosure is not limited thereto. In a similar way, the insulating material 118 may further include inorganic filler or inorganic compound (e.g. silica, clay, and so on) which can be added therein to optimize coefficient of thermal expansion (CTE) of the insulating material 118.

Figure 1H:
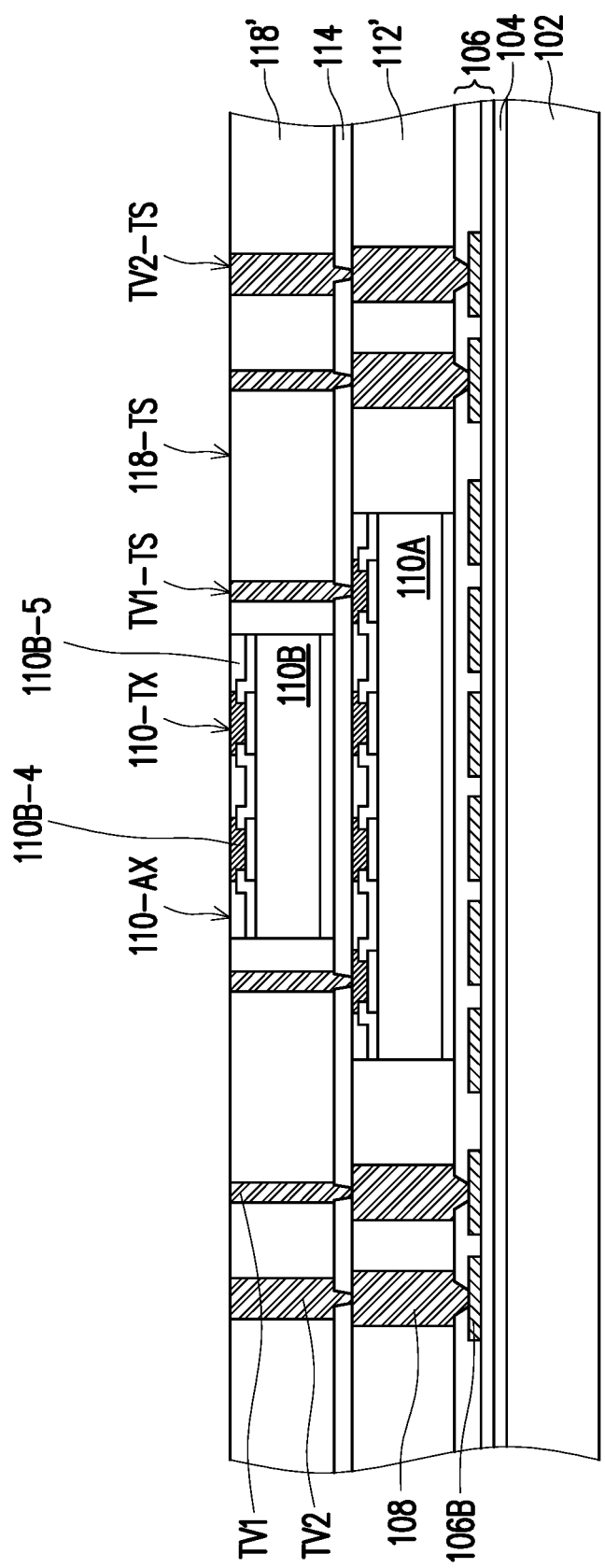

Referring to FIG. 1H, in a next step, the insulating material 118 is partially removed to expose the conductive posts 110B-4, the first through insulator vias TV1 and the second through insulator vias TV2. In some embodiments, the insulating material 118 and the protection layer 110B-5 are ground or polished by a planarization step. For example, the planarization step is performed through a mechanical grinding process and/or a chemical mechanical polishing (CMP) process until the top surfaces 110-TX of the conductive posts 110B-4 are revealed. In some embodiments, the first and second through insulator vias (TV1/TV2) may be partially polished so that the top surfaces TV1-TS of the first through insulator vias TV1 and the top surfaces TV2-TS of the second insulator vias TV2 are leveled with the top surfaces 110-Tx of the conductive posts 110B-4, or leveled with the active surface 110-AX of the semiconductor die 110B. In other words, the conductive posts 110B-4 and the first and second through insulator vias (TV1/TV2) may also be slightly grinded/polished.

In the illustrated embodiment, the insulating material 118 is polished to form an insulating encapsulant 118' (first insulating encapsulant or top insulating encapsulant). In some embodiments, the top surface 118-TS of the insulating encapsulant 118', the top surface TV1-TS of the first through insulator vias TV1, the top surface TV2-TS of the second through insulator vias TV2, the top surface 110-Tx of the conductive posts 110B-4, and the top surface of the polished protection layer 110B-5 are coplanar and leveled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

As illustrated in FIG. 1H, the insulating encapsulant 118' is formed to encapsulate the semiconductor die 110B, the first through insulator vias TV1 and the second through insulator vias TV2. In the exemplary embodiment, the first through insulator vias TV1 are located in a central area of the insulating encapsulant 118' surrounding the semiconductor die 110B. In certain embodiments, the second through insulator vias TV2 are located in a peripheral area of the insulating encapsulant 118' surrounding the first through insulator vias TV1 located in the central area.

Figure 1I:
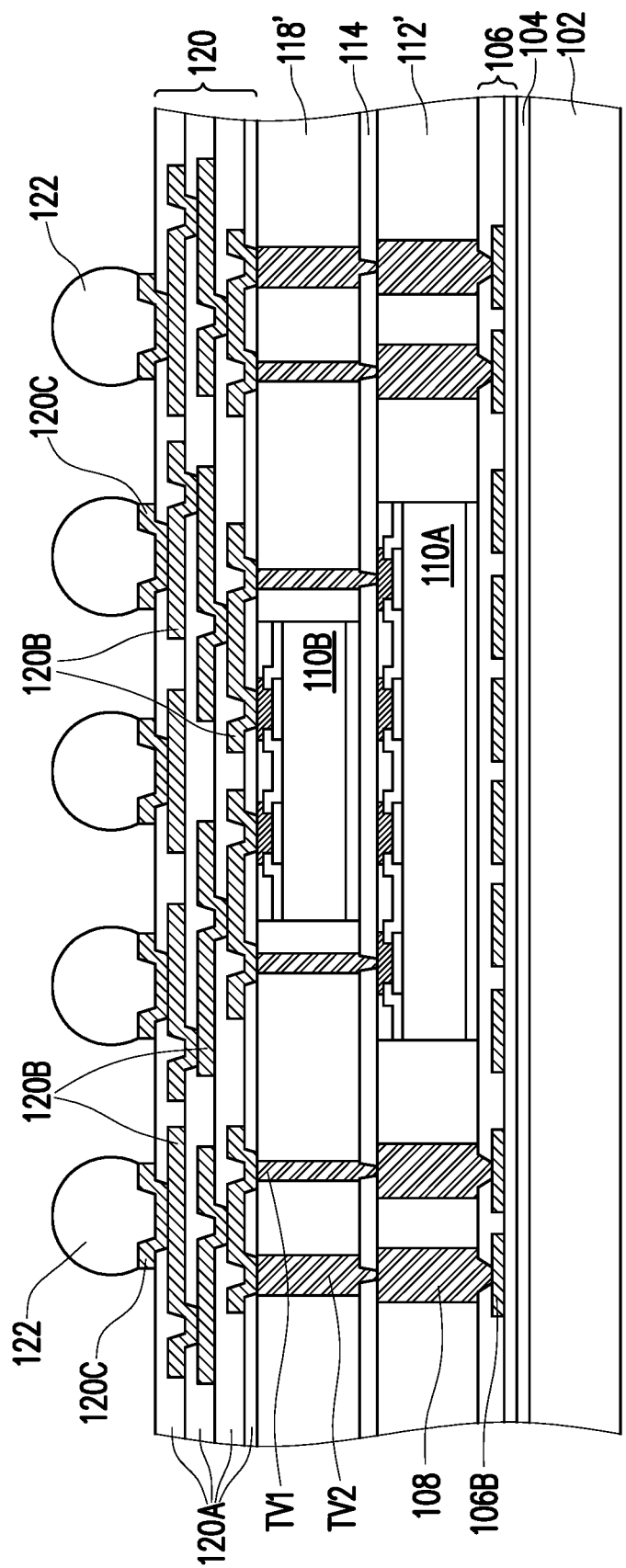

Referring to FIG. 1I, after forming the insulating encapsulant 118', a redistribution layer 120 (top redistribution layer) is formed on the insulating encapsulant 118', the first through insulator vias TV1, the second through insulator vias TV2 and over the semiconductor die 110B. For example, the redistribution layer 120 is formed on the top surface TV1-TS of the first through insulator vias TV1, on the top surface TV2-TS of the second through insulator vias TV2, on the top surface 110-Tx of the conductive posts 110B-4, and on the top surface 118-TS of the insulating encapsulant 118'. In some embodiments, the redistribution layer 120 is electrically connected to the first and second through insulator vias (TV1/TV2), and is electrically connected to the semiconductor die 110B through the conductive posts 110B-4. In some embodiments, the semiconductor die 110B is electrically connected to the first and second through insulator vias (TV1/TV2) through the redistribution layer 120. In certain embodiments, the semiconductor die 110A is electrically connected to the redistribution layer 120 through the first through insulator vias TV1.

In some embodiments, the formation of the redistribution layer 120 includes sequentially forming one or more dielectric layers 120A, and one or more conductive layers 120B in alternation. In certain embodiments, the conductive layers 120B are sandwiched between the dielectric layers 120A. Although only three layers of the conductive layers 120B and four layers of dielectric layers 120A are illustrated herein, however, the scope of the disclose is not limited by the embodiments of the disclosure. In other embodiments, the number of conductive layers 120B and the dielectric layers 120A may be adjusted based on product requirement. In some embodiments, the conductive layers 120B are electrically connected to the conductive posts 110B-4 of the semiconductor die 110B. Furthermore, the conductive layers 120B are electrically connected to the first through insulator vias TV1 and the second through insulator vias TV2. In some embodiments, the materials of the dielectric layer 120A and the conductive layer 120B of the redistribution layer 120 are similar to materials of the dielectric layer 106A and the conductive layer 106B mentioned for the redistribution layer 106. Therefore, the detailed description of the dielectric layer 120A and the conductive layer 120B will be omitted herein.

After forming the redistribution layer 120, a plurality of conductive pads 120C may be disposed on an exposed top surface of the topmost layer of the conductive layers 120B for electrically connecting with conductive balls. In certain embodiments, the conductive pads 120C are for example, under-ball metallurgy (UBM) patterns used for ball mount. As shown in FIG. 1I, the conductive pads 120C are formed on and electrically connected to the redistribution layer 120. In some embodiments, the materials of the conductive pads 120C may include copper, nickel, titanium, tungsten, or alloys thereof or the like, and may be formed by an electroplating process, for example. The number of conductive pads 120C are not limited in this disclosure, and may be selected based on the design layout. In some alternative embodiments, the conductive pads 120C may be omitted. In other words, conductive balls 122 formed in subsequent steps may be directly disposed on the redistribution layer 120.

After forming the conductive pads 120C, a plurality of conductive balls 122 is disposed on the conductive pads 120C and over the redistribution layer 120. In some embodiments, the conductive balls 122 may be disposed on the conductive pads 120C by a ball placement process or reflow process. In some embodiments, the conductive balls 122 are, for example, solder balls or ball grid array (BGA) balls. In some embodiments, the conductive balls 122 are connected to the redistribution layer 120 through the conductive pads 120C. In certain embodiments, some of the conductive balls 122 may be electrically connected to the semiconductor die 110B through the redistribution layer 120. Furthermore, some of the conductive balls 122 may be electrically connected to the first through insulator vias TV1 and the second through insulator vias TV2 through the redistribution layer 120. The number of the conductive balls 122 is not limited to the disclosure, and may be designated and selected based on the number of the conductive pads 120C. In some alternative embodiments, an integrated passive device (IPD) (not shown) may optionally be disposed on the redistribution layer 120 and be electrically connected to the redistribution layer 120.

Figure 1J:
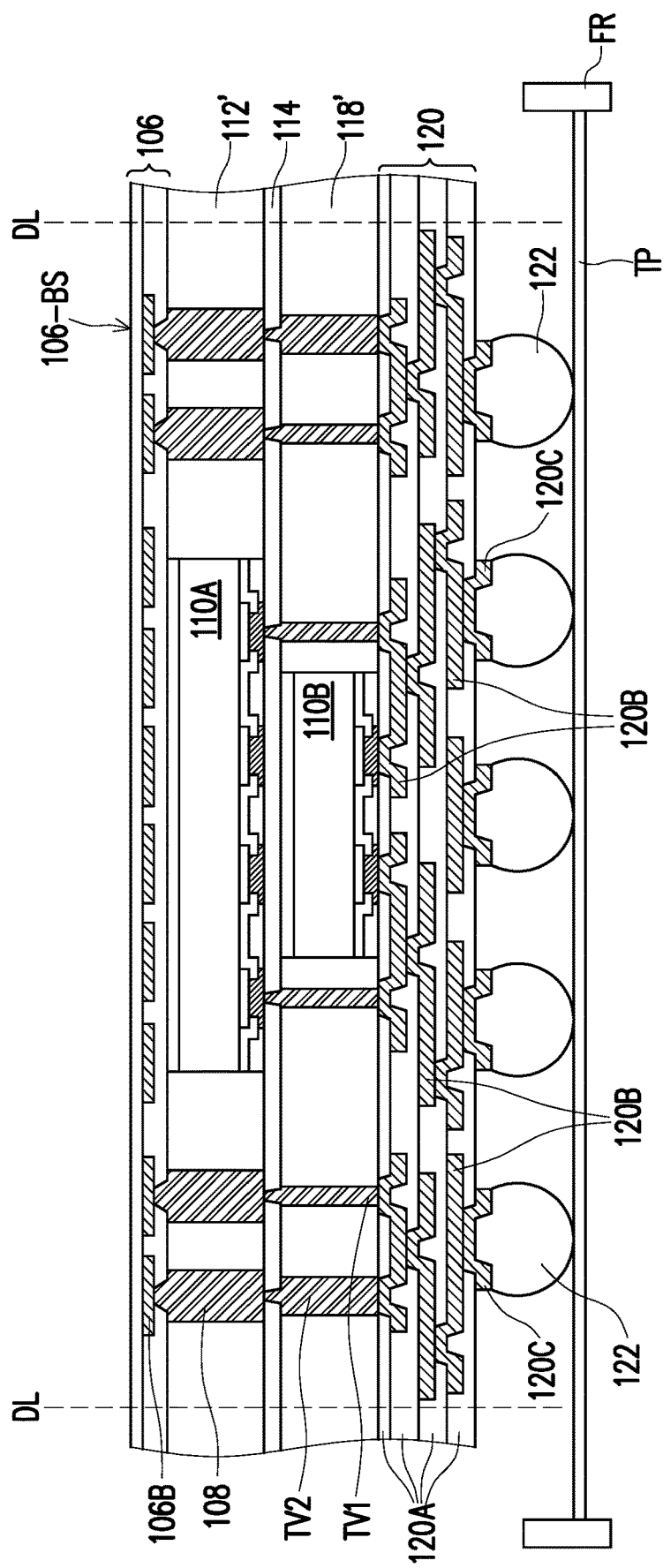

Referring to FIG. 1J, in some embodiments, after forming the redistribution layer 120 and placing the conductive balls 122 thereon, the structure shown in FIG. 1I may be turned upside down and attached to a tape TP (e.g., a dicing tape) supported by a frame FR. As illustrated in FIG. 1J, the carrier 102 is debonded and is separated from the redistribution layer 106. In some embodiments, the de-bonding process includes projecting a light such as a laser light or an UV light on the debond layer 104 (e.g., the LTHC release layer) so that the carrier 102 can be easily removed along with the debond layer 104. During the de-bonding step, the tape TP is used to secure the package structure before de-bonding the carrier 102 and the debond layer 104. After the de-bonding process, a backside surface 106-BS of the redistribution layer 106 is revealed or exposed. In certain embodiments, a dielectric layer 106A of the redistribution layer 106 is revealed or exposed.

Figure 1K:
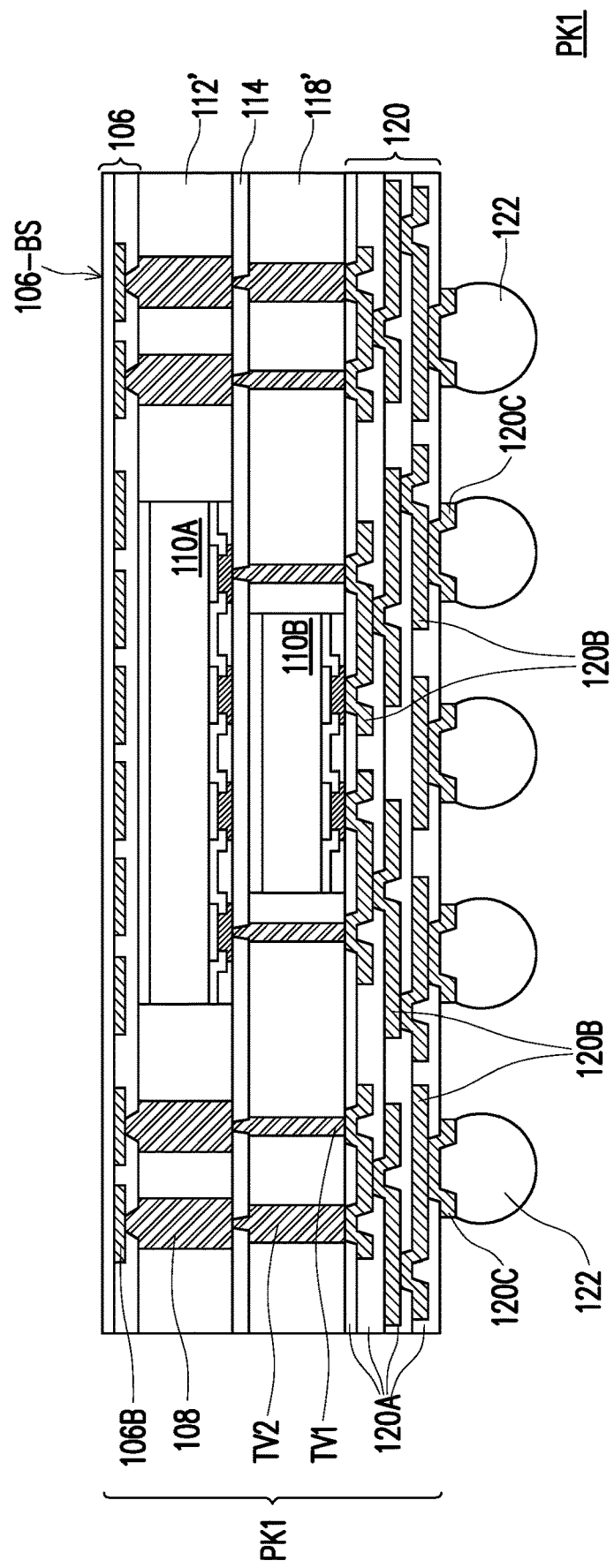

Referring to FIG. 1K, after the de-bonding process, a dicing process is performed along the dicing lines DL (shown in FIG. 1J) to cut the whole wafer structure (cutting through the insulating encapsulants 112' and 118', the dielectric layer 114, and the redistribution layers 106 and 120) into a plurality of package structures PK1 (first package). In the exemplary embodiment, the dicing process is a wafer dicing process including mechanical blade sawing or laser cutting. In a subsequent process, the separated package structures PK1 (first package) may for example, be disposed onto a circuit substrate or onto other components based on requirements.

Figure 1L:
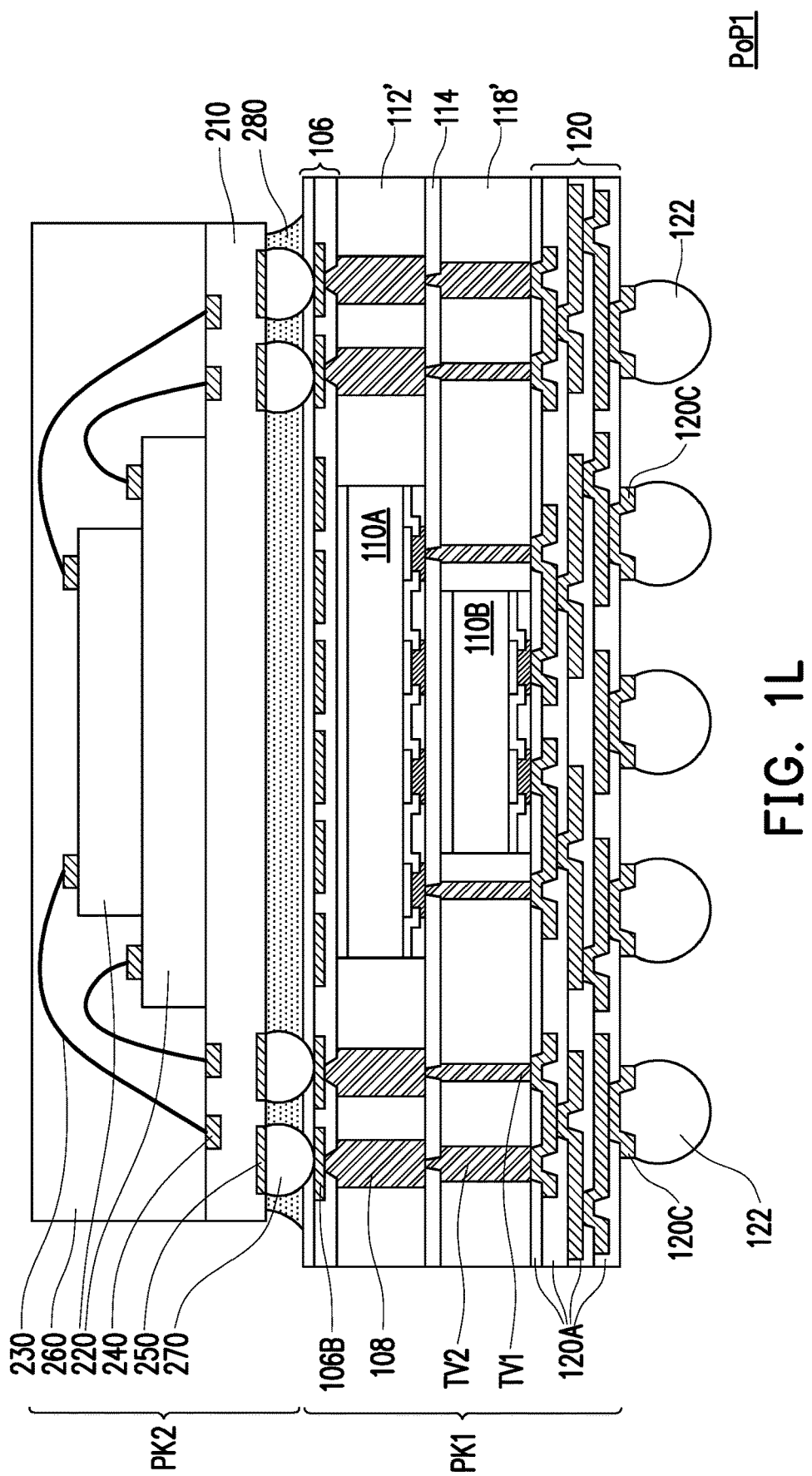

FIG. 1L is a schematic sectional view of a package-on-package (PoP) structure PoP1 according to some exemplary embodiments of the present disclosure. Referring to FIG. 1L, after fabricating a first package, such as the package structure PK1 illustrated in FIG. 1K, a second package PK2 may be stacked on the package structure PK1 (first package) so as to form a package-on-package (PoP) structure.

As illustrated in FIG. 1L, the second package PK2 is electrically connected to the conductive layer 106B of the package structure PK1 (first package). In some embodiments, the second package PK2 has a substrate 210, a plurality of semiconductor chips 220 mounted on one surface (e.g. top surface) of the substrate 210 and stacked on top of one another. In some embodiments, bonding wires 230 are used to provide electrical connections between the semiconductor chips 220 and pads 240 (such as bonding pads). In some embodiments, an insulating encapsulant 260 is formed to encapsulate the semiconductor chips 220 and the bonding wires 230 to protect these components. In some embodiments, through insulator vias (not shown) may be used to provide electrical connection between the pads 240 and conductive pads 250 (such as bonding pads) that are located on another surface (e.g. bottom surface) of the substrate 210. In certain embodiments, the conductive pads 250 are electrically connected to the semiconductor chips 220 through these through insulator vias (not shown). In some embodiments, the conductive pads 250 of the second package PK2 are electrically connected to electrical connectors 270. Furthermore, the electrical connectors 270 are electrically connected to the conductive layer 106B of the redistribution layer 106 in the package structure PK1 (first package). In certain embodiments, the second package PK2 is electrically connected to the first through insulator vias TV1 and the second through insulator vias TV2 through the electrical connectors 270. In some embodiments, an underfill 280 is further provided to fill in the spaces between the electrical connectors 270 to protect the electrical connectors 270. After stacking the second package PK2 on the package structure PK1 (first package) and providing electrical connection therebetween, the fabrication of a package-on-package structure PoP1 is accomplished.

Figure 2:
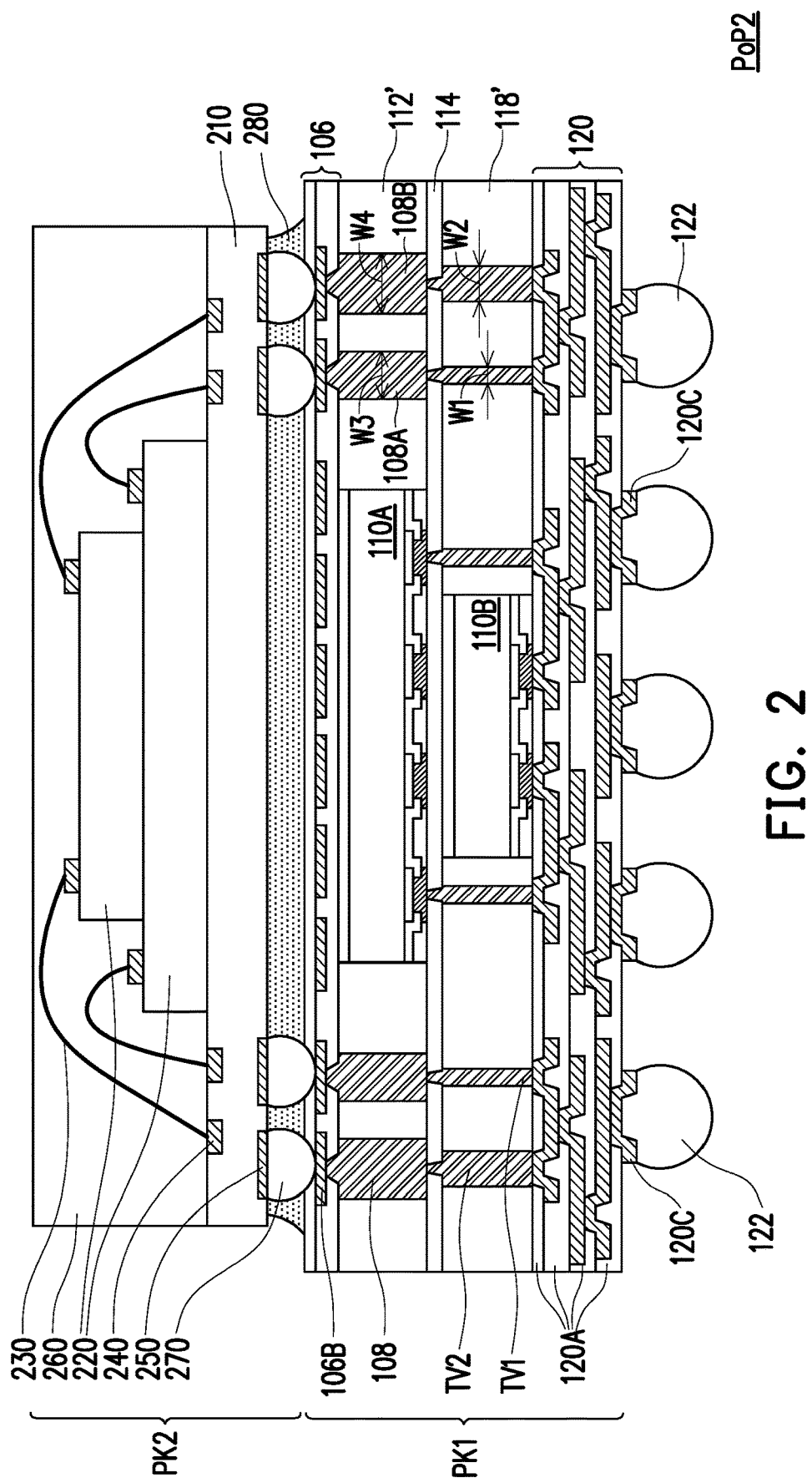
FIG. 2 is a schematic sectional view of a package-on-package (PoP) structure according to some exemplary embodiments of the present disclosure.

FIG. 2 is a schematic sectional view of a package-on-package (PoP) structure according to some exemplary embodiments of the present disclosure. The PoP structure PoP2 illustrated in FIG. 2 is similar to the PoP structure PoP1 illustrated in FIG. 1L, hence the same reference numerals are used to refer to the same or liked parts, and its detailed description will be omitted herein. The difference between the embodiments is in the design of the connecting vias located in the insulating encapsulant 112'.

As illustrated in FIG. 2, in some embodiments, a plurality of first connecting vias 108A is located in a central area of the insulating encapsulant 112' (second insulating encapsulant) and being electrically connected to the first through insulator vias TV1. Furthermore, in some embodiments, a plurality of second connecting vias 108B is located in a peripheral area of the insulating encapsulant 112' surrounding the first connecting vias 108A located in the central area, and being electrically connected to the second through insulator vias TV2. In the illustrated embodiment, a size of the plurality of second connecting vias 108B is greater than a size of the plurality of first connecting vias 108A. In some embodiments, the first through insulator vias TV has a width of W1, the second through insulator vias TV2 has a width of W2, the first connecting vias 108A has a width of W3, and the second connecting vias 108B has a width of W4, wherein W1<W2≤W3<W4. In other words, a size of the second connecting vias 108B may be greater than a size of the second through insulator vias TV2, while a size of the first connecting vias 108A may be greater than a size of the first through insulator vias TV1.

Figure 3:
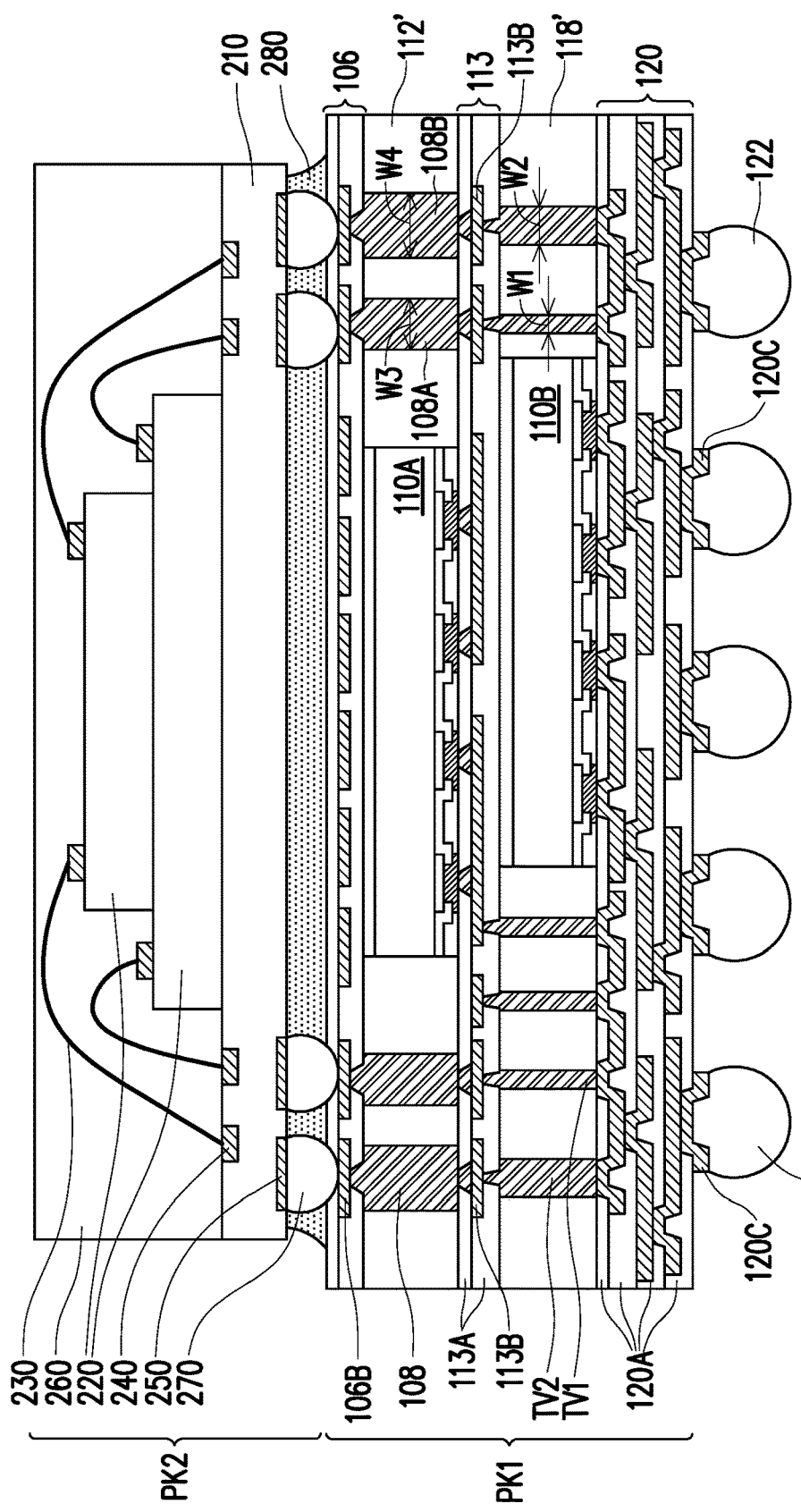
FIG. 3 is a schematic sectional view of a package-on-package (PoP) structure according to some other exemplary embodiments of the present disclosure.

FIG. 3 is a schematic sectional view of a package-on-package (PoP) structure according to some other exemplary embodiments of the present disclosure. The PoP structure PoP3 illustrated in FIG. 3 is similar to the PoP structure PoP2 illustrated in FIG. 2, hence the same reference numerals are used to refer to the same or liked parts, and its detailed description will be omitted herein. The difference between the embodiments is that a redistribution layer 113 is used in replacement of the dielectric layer 114, and that the semiconductor dies 110A and 110B have approximately the same sizes or dimensions.

As illustrated in FIG. 3, in some embodiments, a redistribution layer 113 is provided in between the insulating encapsulant 112' and the insulating encapsulant 118' for providing electrical connection therebetween. Due to the size and arrangements of the semiconductor dies 110A and 110B, the redistribution layer 113 is used for providing an electrical connection route from the semiconductor die 110A to the redistribution layer 120. In some embodiments, the redistribution layer 113 may include one or more dielectric layers 113A and one or more conductive layers 113B formed in alternation. In some embodiments, the materials of the dielectric layer 113A and the conductive layer 113B of the redistribution layer 113 are similar to materials of the dielectric layer 106A and the conductive layer 106B mentioned for the redistribution layer 106. Therefore, the detailed description of the dielectric layer 113A and the conductive layer 113B will be omitted herein. In some embodiments, the redistribution layer 113 is electrically connected to the first and second connecting vias (108A/108B) through the conductive layer 113B. Furthermore, the redistribution layer 113 is electrically connected to the first through insulator vias TV1 or the second through insulator vias TV2 through the conductive layer 113B. In certain embodiments, the conductive layer 113B is further electrically connected to the conductive posts 110A-4 of the semiconductor die 110A.

Figure 4:
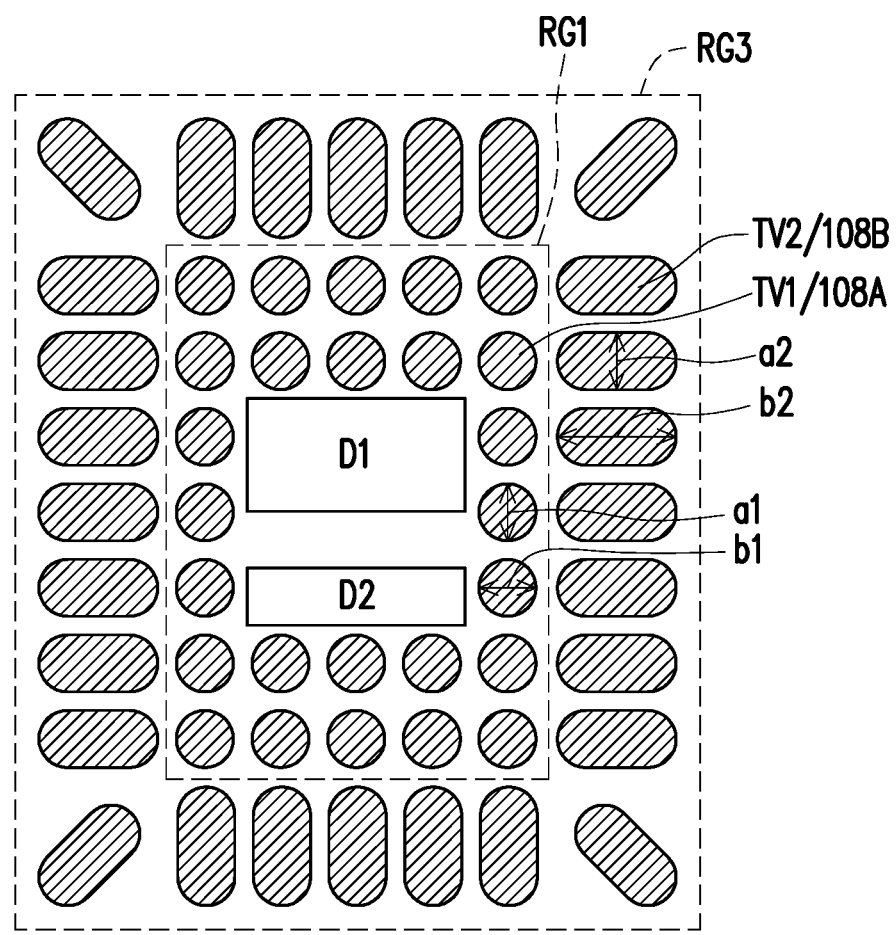
FIG. 4 is a schematic top view of a package structure according to some exemplary embodiments of the present disclosure.

FIG. 4 is a schematic top view of a package structure according to some exemplary embodiments of the present disclosure. The top view may correspond to a top view of any package structures (e.g. PoP1, PoP2 etc.) having first and second through insulator vias (TV1/TV2), or any package structures (e.g. PoP2 etc.) having first and second connecting vias (108A/108B) described throughout the disclosure. The top view is focused on the arrangement of through insulator vias (TV1/TV2) or connecting vias (108A/108B) around the semiconductor dies (D1/D2), hence, other components are omitted for ease of illustration.

As illustrated in FIG. 4, a semiconductor die D1 and a semiconductor D2 is provided. The semiconductor die D1 and the semiconductor D2 may correspond to any of the semiconductor dies 110A and 110B mentioned previously. In some embodiments, the semiconductor die D1 and the semiconductor die D2 may be the same type of semiconductor dies. In alternative embodiments, the semiconductor die D1 and the semiconductor die D2 may be different type of semiconductor dies. The disclosure is not limited thereto. Furthermore, the size and dimensions of the semiconductor die D1 and the semiconductor D2 is not particularly limited, and may be appropriately adjusted based on design requirement. Although only two semiconductor dies D1 and D2 are illustrated herein, however, the disclosure is not limited thereto. For example, the number of semiconductor dies may be one or more than one, which is adjusted based on design requirement.

In the illustrated embodiment, the semiconductor dies D1 and D2 are located in a first region RG1 of the insulating encapsulant (112' or 118'). In some embodiments, a plurality of first through insulator vias TV1 (or first connecting vias 108A) is located in the first region RG1 to surround the semiconductor dies D1 and D2. In certain embodiments, a plurality of second through insulator vias TV2 (or second connecting vias 108B) is located in a third region RG3 of the insulating encapsulant (112' or 118') at the peripheral of the first region RG1. For example, in some embodiments, the third region RG3 surrounds the first region RG1. In certain embodiments, the first region RG1 corresponds to a central area of the insulating encapsulant (112' or 118'), whereas the third region RG3 corresponds to a peripheral area of the insulating encapsulant (112' or 118'). As illustrated from the top view shown in FIG. 4, a shape of the second through insulator vias TV2 (or second connecting vias 108B) is different than a shape of the first through insulator vias TV1 (or first connecting vias 108A). For example, the first through insulator vias TV1 (or first connecting vias 108A) has a circular shape from a top view, and the second through insulator vias TV2 (or second connecting vias 108B) has an oval shape from the top view.

In some embodiments, the first through insulator vias TV1 (or first connecting vias 108A) may have a width of a1 and a length of b1, wherein an aspect ratio (length:width) of the first through insulator vias TV1 (or first connecting vias 108A) is 1:1. In certain embodiments, the second through insulator vias TV2 (or second connecting vias 108B) may have a width of a2 and a length of b2, wherein an aspect ratio (length:width) of the second through insulator vias TV2 is in a range of 1.1:1 to 3:1. In other words, an aspect ratio of the second through insulator vias TV2 (or second connecting vias 108B) may be greater than an aspect ratio of the first through insulator vias TV1 (or first connecting vias 108A).

Figure 5:
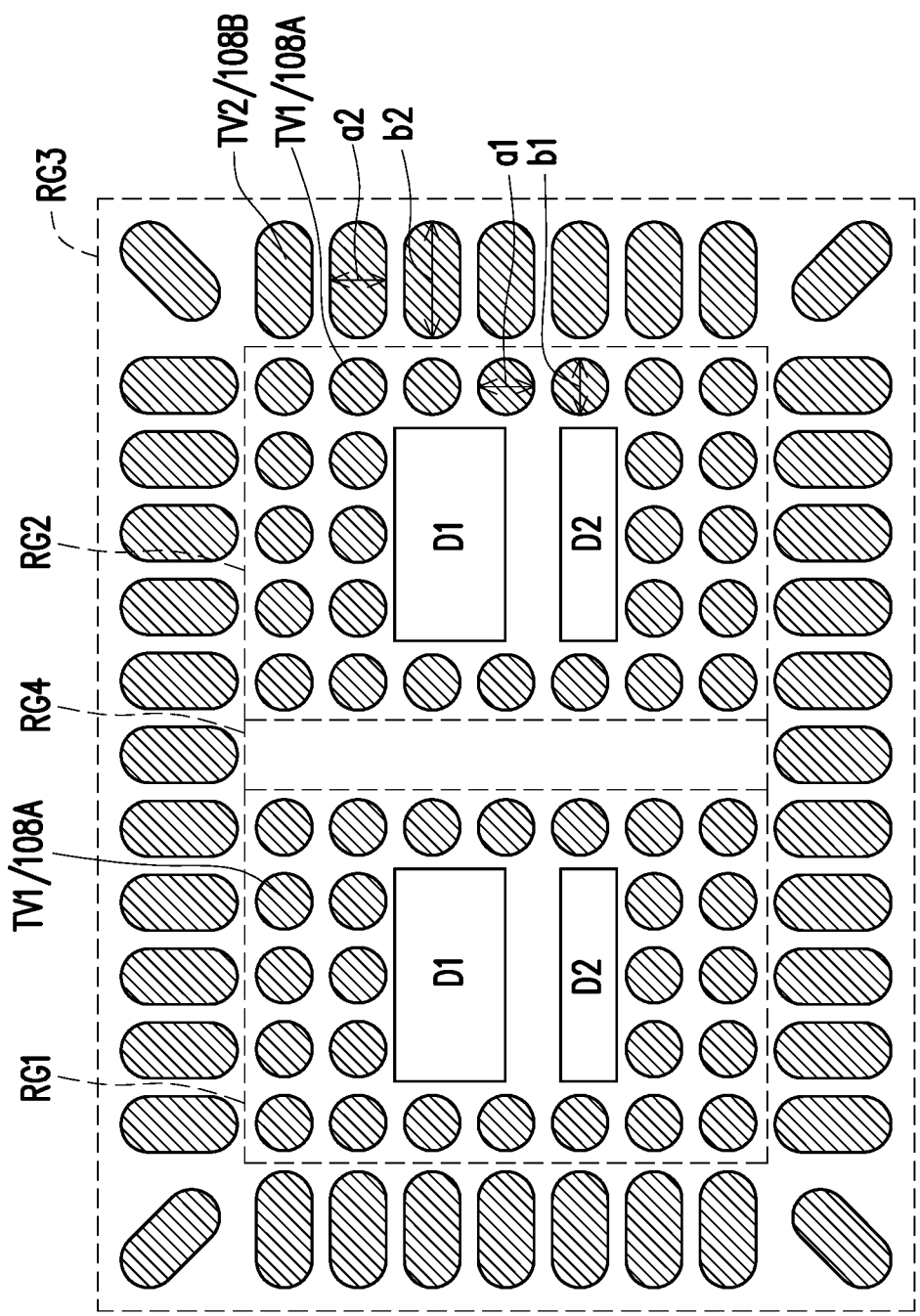
FIG. 5 is a schematic top view of a package structure according to some other exemplary embodiments of the present disclosure.

FIG. 5 is a schematic top view of a package structure according to some other exemplary embodiments of the present disclosure. The embodiment shown in FIG. 5 is similar to the embodiment shown in FIG. 4, hence the same reference numerals are used to refer to the same or liked parts, and its detailed description will not be repeated herein. The difference between the embodiments is that a second region RG2 and a fourth region RG4 is further defined in the insulating encapsulant (112' or 118') of FIG. 5.

As illustrated in FIG. 5, the first through insulator vias TV1 (or first connecting vias 108A) are located in the first region RG1 and the second region RG2 of the insulating encapsulant (112' or 118') to surround the semiconductor dies D1 and D2. In some embodiments, the second through insulator vias TV2 (or second connecting vias 108B) are located in a third region RG3 of the insulating encapsulant (112' or 118') at the peripheral of the first region RG1 and the second region RG2 to surround the first region RG1 and the second region RG2. Furthermore, in some embodiments, the insulating encapsulant (112' or 118') further comprises a fourth region RG4 that is surrounded by the third region RG3 and located in between the first region RG1 and the second region RG2. In certain embodiments, the fourth region RG4 contain no through insulator vias or connecting vias embedded therein, and the fourth region RG4 separates the first region from the second region RG2.

Similar to FIG. 4, the top view shown in FIG. 5 may correspond to a top view of any package structures (e.g. PoP1, PoP2 etc.) having first and second through insulator vias (TV1/TV2), or any package structures (e.g. PoP2 etc.) having first and second connecting vias (108A/108B) described throughout the disclosure.

Figure 6:
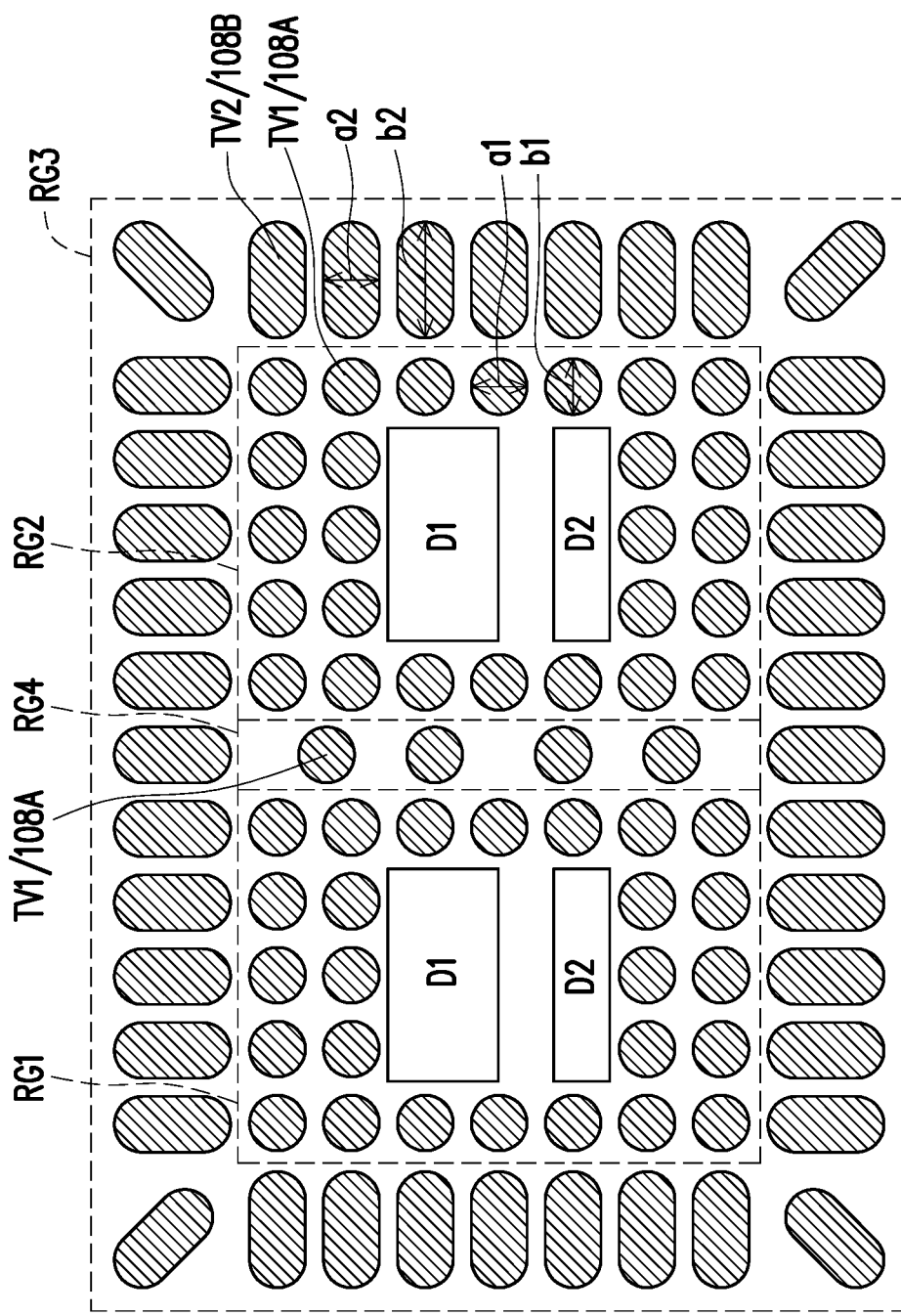
FIG. 6 is a schematic top view of a package structure according to some other exemplary embodiments of the present disclosure.

FIG. 6 is a schematic top view of a package structure according to some other exemplary embodiments of the present disclosure. The embodiment shown in FIG. 6 is similar to the embodiment shown in FIG. 5, hence the same reference numerals are used to refer to the same or liked parts, and its detailed description will not be repeated herein. The difference between the embodiments is in the arrangement of the fourth region RG4. As illustrated in FIG. 6, in some embodiments, the first through insulator vias TV1 (or first connecting vias 108A) may be further located in the fourth region RG4. In some embodiments, the spacing of the first through insulator vias TV1 (or first connecting vias 108A) located in the fourth region RG4 may be arranged differently to the spacing of the first through insulator vias TV1 (or first connecting vias 108A) located in the first region RG1 and the second region RG2. For example, the first through insulator vias TV1 (or first connecting vias 108A) located in the fourth region RG4 may have a greater spacing as compared to the first through insulator vias TV1 (or first connecting vias 108A) located in the first region RG1 and the second region RG2.

Similar to the above embodiments, the top view shown in FIG. 6 may correspond to a top view of any package structures (e.g. PoP1, PoP2 etc.) having first and second through insulator vias (TV1/TV2), or any package structures (e.g. PoP2 etc.) having first and second connecting vias (108A/108B) described throughout the disclosure.

Figure 7:
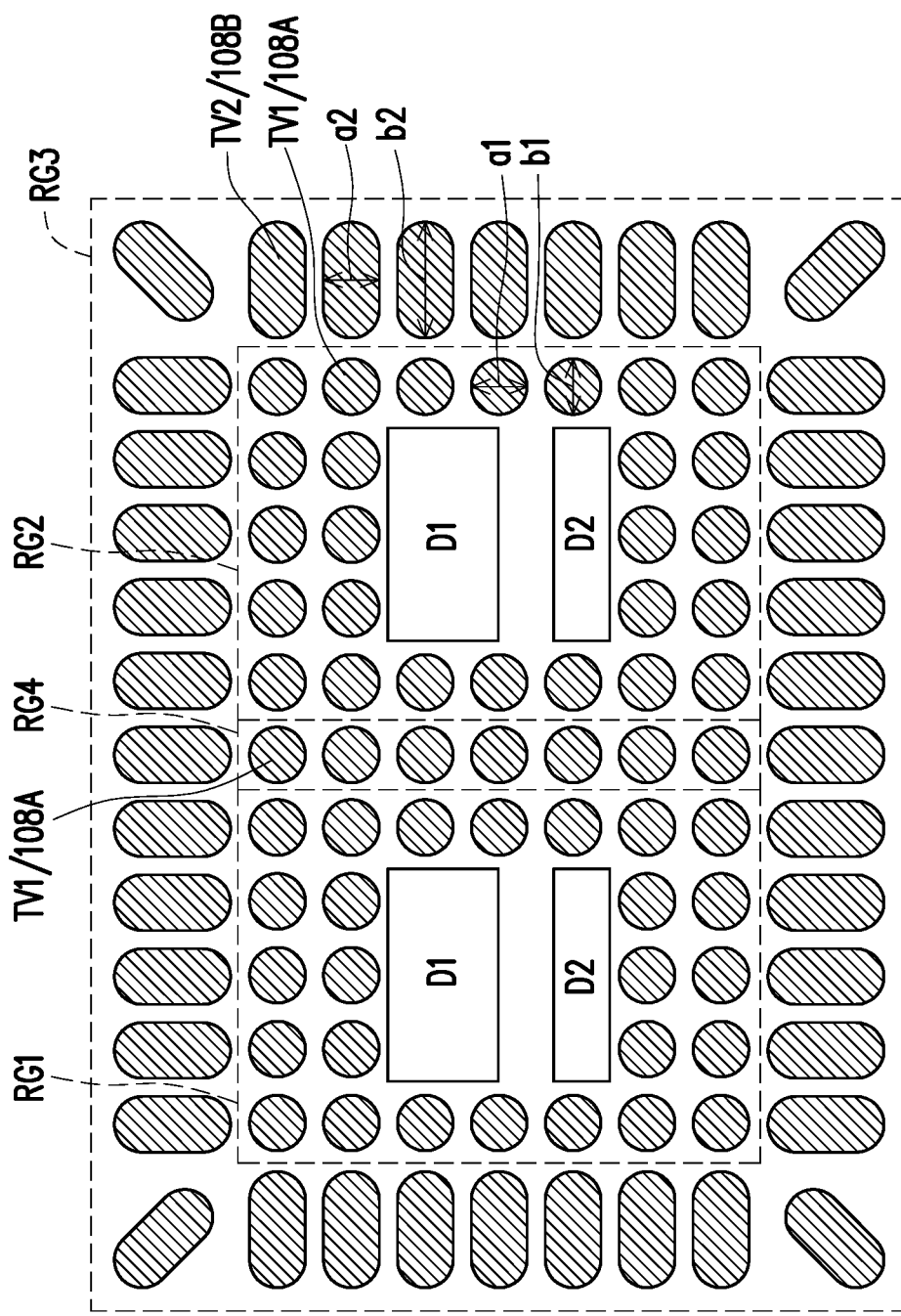
FIG. 7 is a schematic top view of a package structure according to some other exemplary embodiments of the present disclosure.

FIG. 7 is a schematic top view of a package structure according to some other exemplary embodiments of the present disclosure. The embodiment shown in FIG. 7 is similar to the embodiment shown in FIG. 6, hence the same reference numerals are used to refer to the same or liked parts, and its detailed description will not be repeated herein. The difference between the embodiments is in the arrangement of the fourth region RG4. As illustrated in FIG. 7, the spacing of the first through insulator vias TV1 (or first connecting vias 108A) located in the fourth region RG4 is substantially equal to the spacing of the first through insulator vias TV1 (or first connecting vias 108A) located in the first region RG1 and the second region RG2.

Similar to the above embodiments, the top view shown in FIG. 7 may correspond to a top view of any package structures (e.g. PoP1, PoP2 etc.) having first and second through insulator vias (TV1/TV2), or any package structures (e.g. PoP2 etc.) having first and second connecting vias (108A/108B) described throughout the disclosure.

Figure 8:
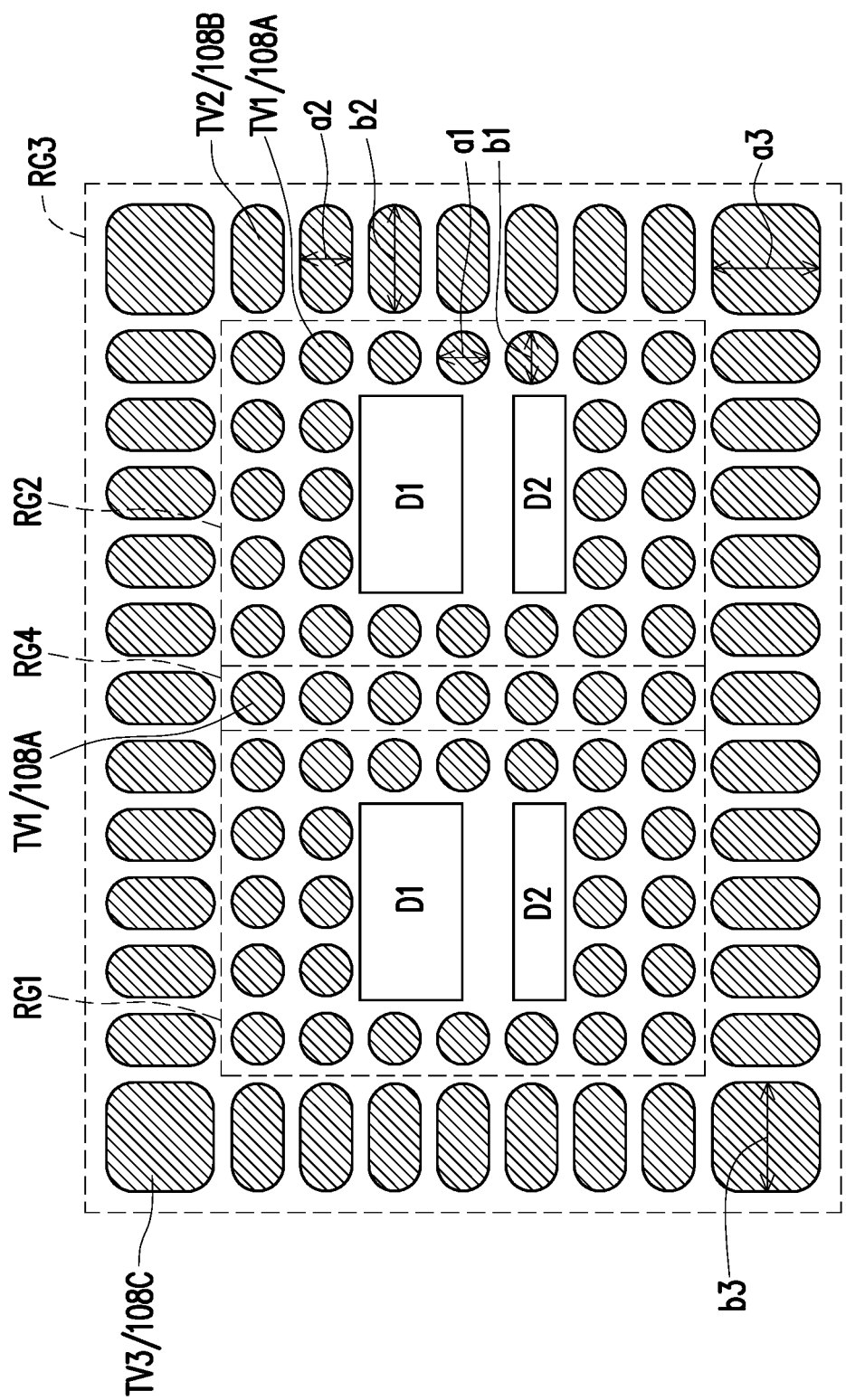
FIG. 8 is a schematic top view of a package structure according to some other exemplary embodiments of the present disclosure.

FIG. 8 is a schematic top view of a package structure according to some other exemplary embodiments of the present disclosure. The embodiment shown in FIG. 8 is similar to the embodiment shown in FIG. 7, hence the same reference numerals are used to refer to the same or liked parts, and its detailed description will not be repeated herein. The difference between the embodiments is that a plurality of third through insulator vias (or third connecting vias) is further included. As illustrated in FIG. 8, a plurality of third through insulator vias TV3 (or third connecting vias 108C) is further located at four corners in the third region RG3 of the insulating encapsulant (112' or 118'). In some embodiments, the third through insulator vias TV3 (or third connecting vias 108C) are located at four corners in the peripheral area of the insulating encapsulant (112' or 118'). In certain embodiments, the third through insulator vias TV3 (or third connecting vias 108C) has a square shape with rounded corners from the top view.

Furthermore, a size of the third through insulator vias TV3 (or third connecting vias 108C) is greater than a size of the first through insulator vias TV1 (or first connecting vias 108A) and a size of the second through insulator vias TV2 (or second connecting vias 108B). For example, the third through insulator vias TV3 (or third connecting vias 108C) may have a width of a3 and a length of b3, wherein an aspect ratio (length:width) of the third through insulator vias TV3 (or third connecting vias 108C) is 1:1. In some embodiments, the width a3 of the third through insulator vias TV3 (or third connecting vias 108C) is greater than the width a2 of the second through insulator vias TV2 (or second connecting vias 108B), and greater than the width a1 of the first through insulator vias TV1 (or first connecting vias 108A).

Similar to the above embodiments, the top view shown in FIG. 8 may correspond to a top view of any package structures (e.g. PoP1, PoP2 etc.) having first and second through insulator vias (TV1/TV2), or any package structures (e.g. PoP2 etc.) having first and second connecting vias (108A/108B) described throughout the disclosure.

Figure 9:
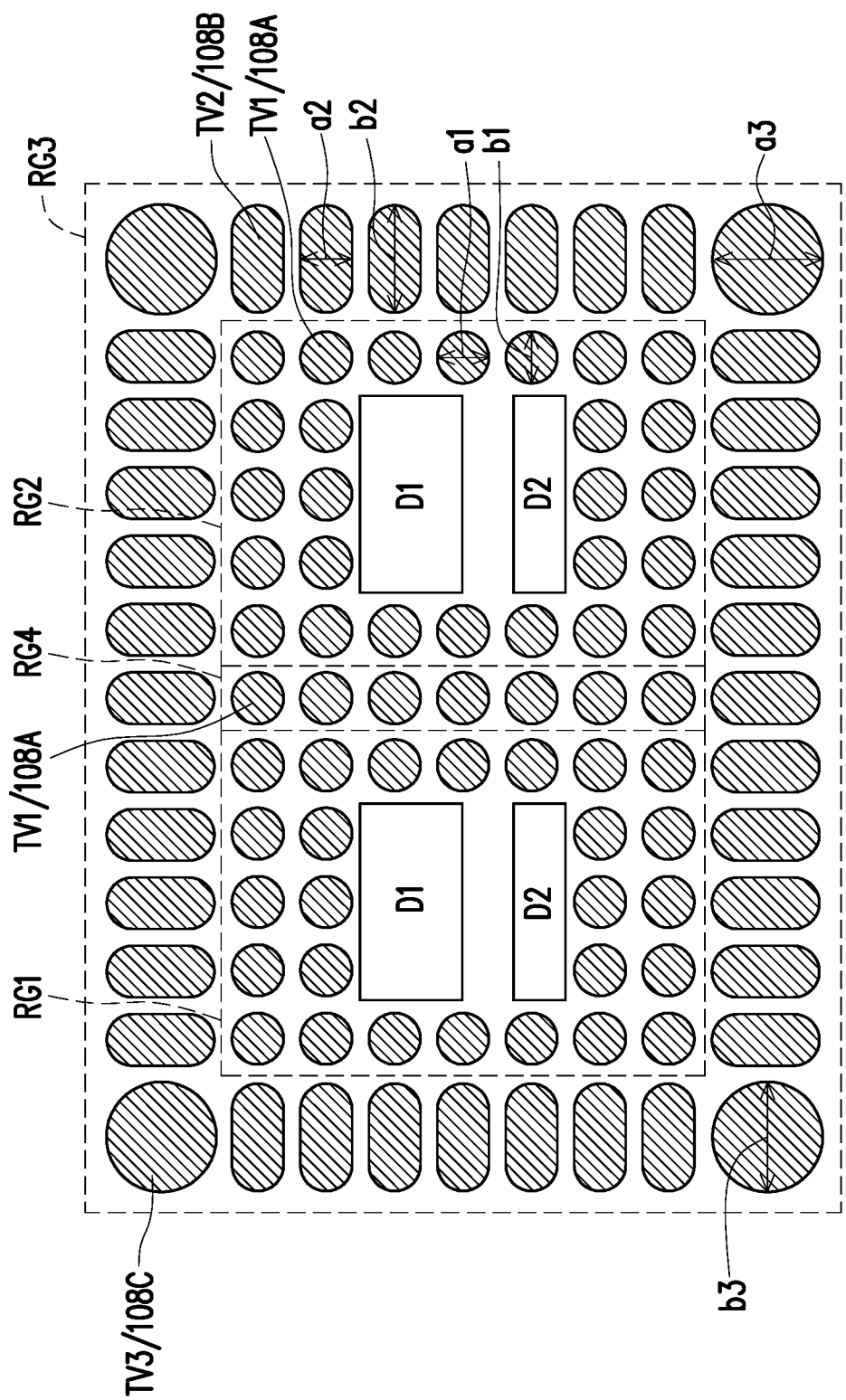
FIG. 9 is a schematic top view of a package structure according to some other exemplary embodiments of the present disclosure.

FIG. 9 is a schematic top view of a package structure according to some other exemplary embodiments of the present disclosure. The embodiment shown in FIG. 9 is similar to the embodiment shown in FIG. 8, hence the same reference numerals are used to refer to the same or liked parts, and its detailed description will not be repeated herein. The difference between the embodiments is in the design of the third through insulator vias TV3 (or third connecting vias 108C). In the embodiment of FIG. 8, the third through insulator vias TV3 (or third connecting vias 108C) has a square shape with rounded corners from the top view. However, the disclosure is not limited thereto. For example, as illustrated in FIG. 9, the third through insulator vias TV3 (or third connecting vias 108C) has a circular shape from the top view.

Similar to the above embodiments, the top view shown in FIG. 9 may correspond to a top view of any package structures (e.g. PoP1, PoP2 etc.) having first and second through insulator vias (TV1/TV2), or any package structures (e.g. PoP2 etc.) having first and second connecting vias (108A/108B) described throughout the disclosure.

Figure 10:
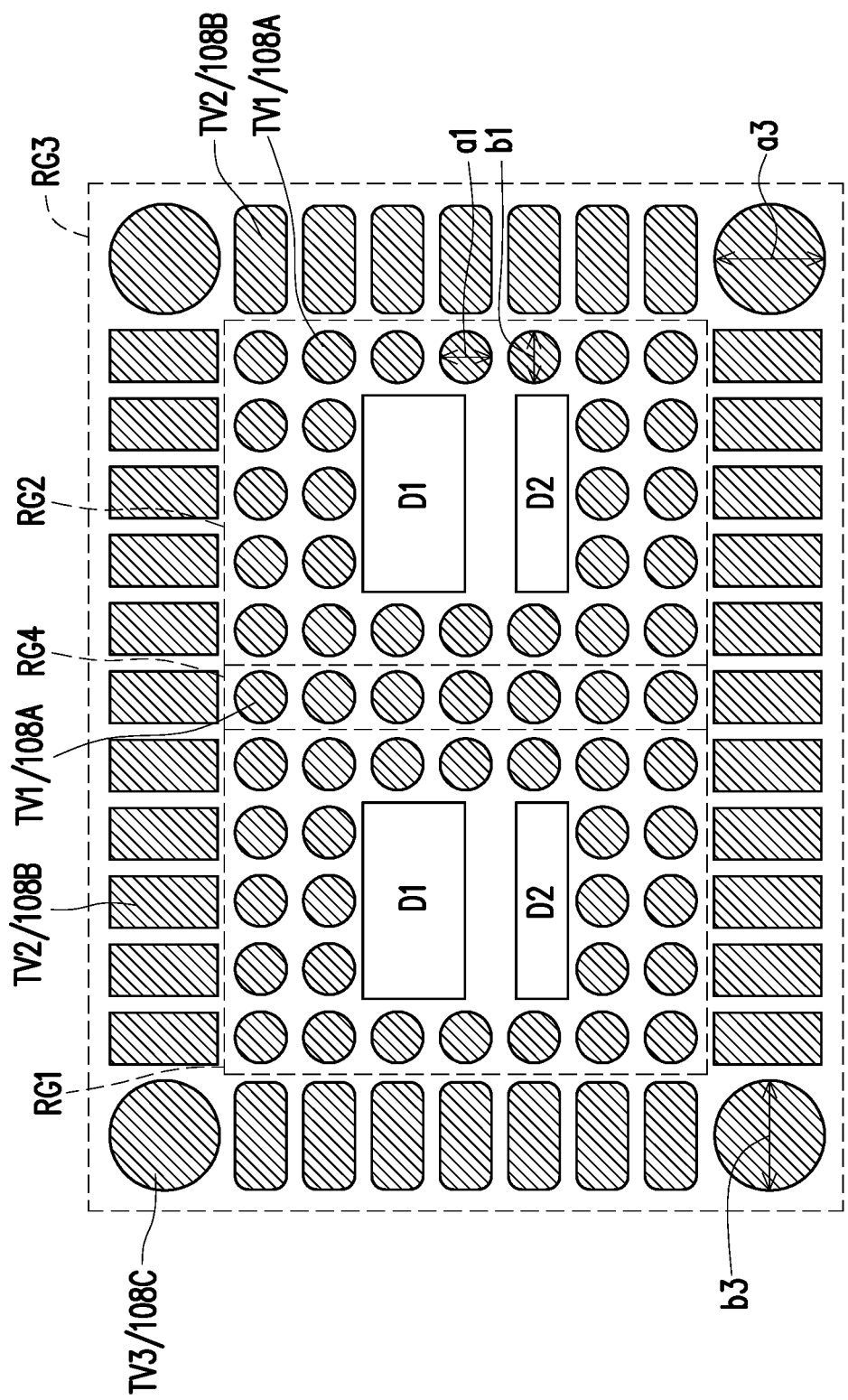
FIG. 10 is a schematic top view of a package structure according to some other exemplary embodiments of the present disclosure.

FIG. 10 is a schematic top view of a package structure according to some other exemplary embodiments of the present disclosure. The embodiment shown in FIG. 10 is similar to the embodiment shown in FIG. 9, hence the same reference numerals are used to refer to the same or liked parts, and its detailed description will not be repeated herein. The difference between the embodiments is in the design of the second through insulator vias TV2 (or second connecting vias 108B). In the previous embodiments, the second through insulator vias TV2 (or second connecting vias 108B) has an oval shape from the top view. However, the disclosure is not limited thereto. For example, as illustrated in FIG. 10, the second through insulator vias TV2 (or second connecting vias 108B) has a rectangular shape from the top view (e.g. those located at upper and lower sides of the semiconductor dies D1/D2 from the top view). Alternatively, the second through insulator vias TV2 (or second connecting vias 108B) has a rectangular shape with rounded corners from the top view (e.g. those located at left and right sides of the semiconductor dies D1/D2 from the top view).

Similar to the above embodiments, the top view shown in FIG. 10 may correspond to a top view of any package structures (e.g. PoP1, PoP2 etc.) having first and second through insulator vias (TV1/TV2), or any package structures (e.g. PoP2 etc.) having first and second connecting vias (108A/108B) described throughout the disclosure.

Figure 11:
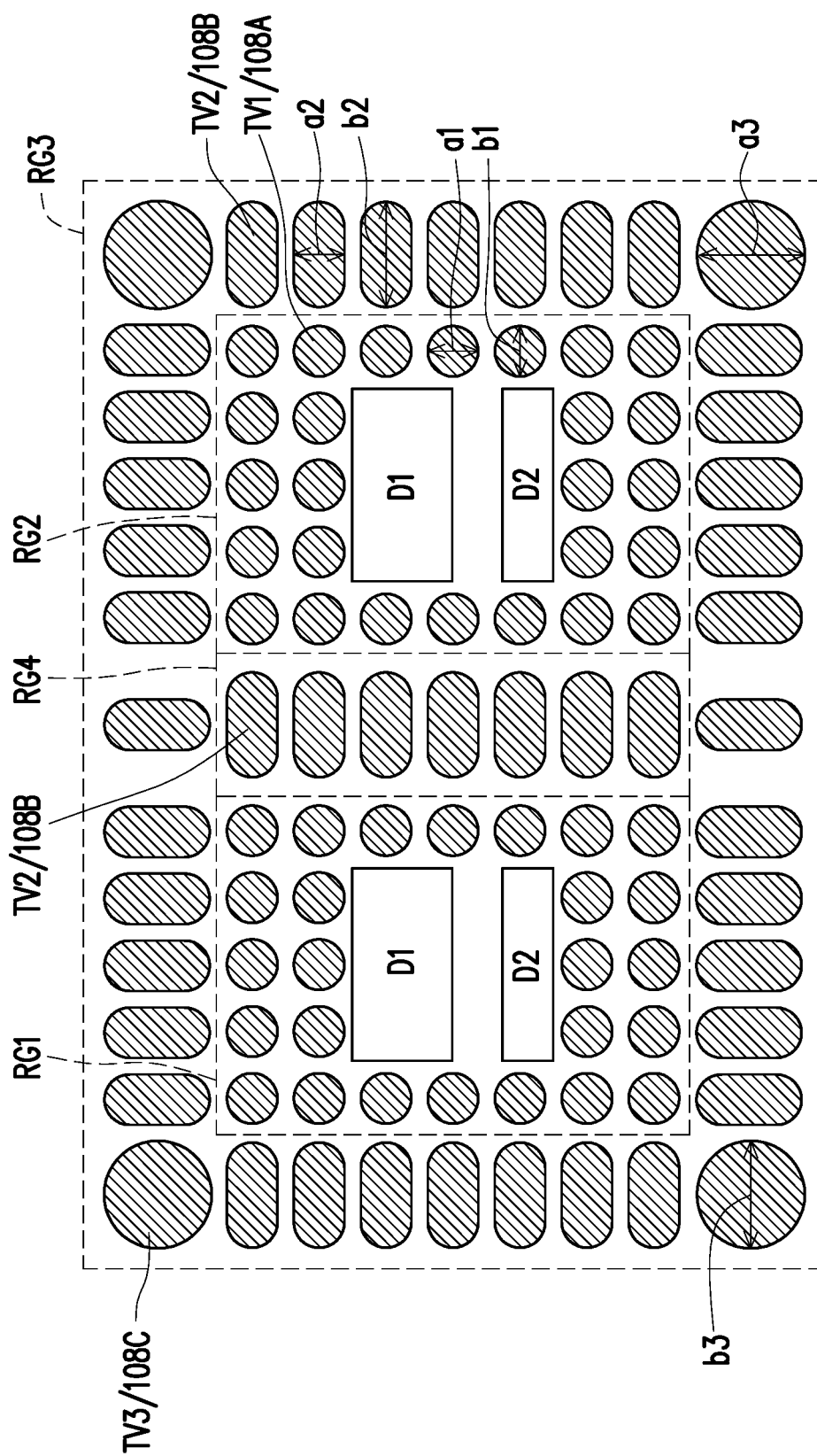
FIG. 11 is a schematic top view of a package structure according to some other exemplary embodiments of the present disclosure.

FIG. 11 is a schematic top view of a package structure according to some other exemplary embodiments of the present disclosure. The embodiment shown in FIG. 11 is similar to the embodiment shown in FIG. 9, hence the same reference numerals are used to refer to the same or liked parts, and its detailed description will not be repeated herein. The difference between the embodiments is in the arrangement of the fourth region RG4. In the previous embodiment, the first through insulator vias TV1 (or first connecting vias 108A) are located in the fourth region RG4 in between the first region RG1 and the second region RG2. However, the disclosure is not limited thereto. For example, as illustrated in FIG. 11, the second through insulator vias TV2 (or second connecting vias 108B) may be further located in the fourth region RG4. In some embodiments, the second through insulator vias TV2 located in the fourth region RG4 has an oval shape from the top view. However, the disclosure is not limited thereto. In alternative embodiments, the shape of the second through insulator vias TV2 located in the fourth region RG4 may be adjusted to a rectangular shape from the top view (with or without rounded corners).

Similar to the above embodiments, the top view shown in FIG. 11 may correspond to a top view of any package structures (e.g. PoP1, PoP2 etc.) having first and second through insulator vias (TV1/TV2), or any package structures (e.g. PoP2 etc.) having first and second connecting vias (108A/108B) described throughout the disclosure.

Figure 12:
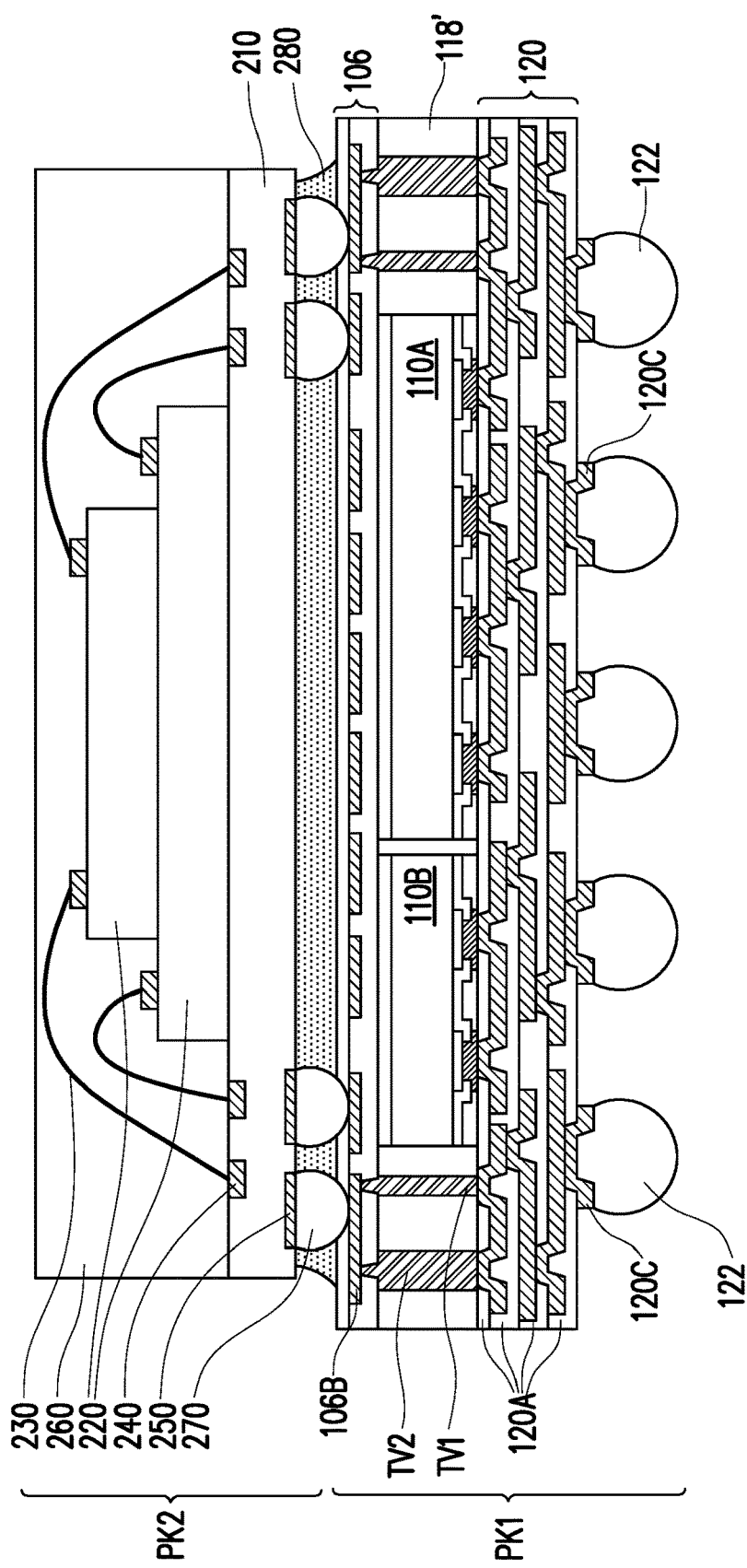
FIG. 12 is a schematic sectional view of a package-on-package (PoP) structure according to some other exemplary embodiments of the present disclosure.

FIG. 12 is a schematic sectional view of a package-on-package (PoP) structure according to some other exemplary embodiments of the present disclosure. The PoP structure PoP4 illustrated in FIG. 12 is similar to the PoP structure PoP1 illustrated in FIG. 1L, hence the same reference numerals are used to refer to the same or liked parts, and its detailed description will be omitted herein.

As illustrated in FIG. 12, the insulating encapsulant 112' is omitted from the package-on-package structure PoP4. In some embodiments, the semiconductor die 110A and the semiconductor die 110B are located aside one another, and being encapsulated by the insulating encapsulant 118'. In some embodiments, the first through insulator vias TV1 is located in a central area of the insulating encapsulant 118' surrounding both of the semiconductor dies 110A and 110B. Furthermore, the second through insulator vias TV2 is located in a peripheral area of the insulating encapsulant 118' surrounding the first through insulator vias TV1.

Figure 13:
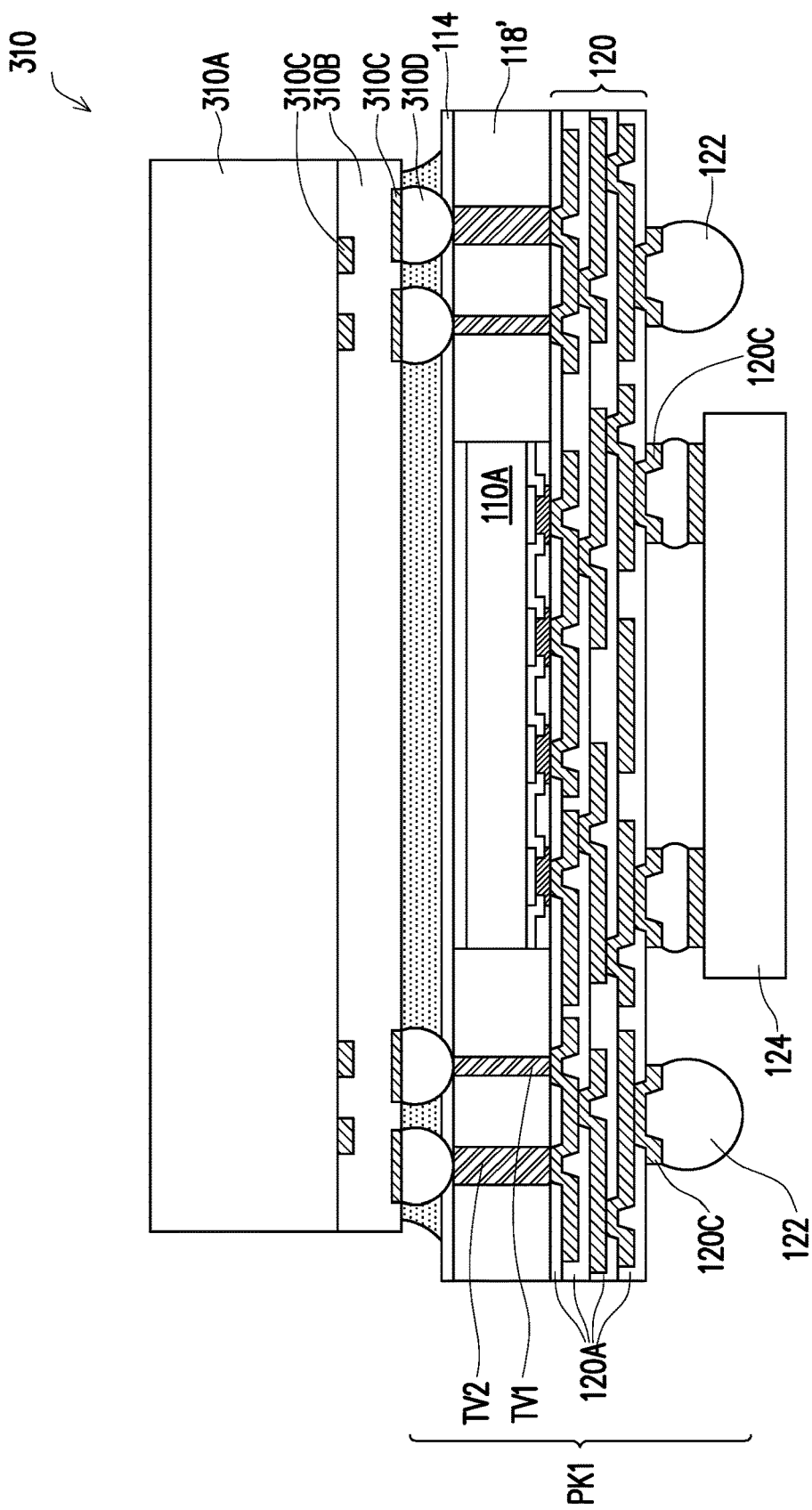
FIG. 13 is a schematic sectional view of a package-on-package (PoP) structure according to some other exemplary embodiments of the present disclosure.

FIG. 13 is a schematic sectional view of a package-on-package (PoP) structure according to some other exemplary embodiments of the present disclosure. The PoP structure PoP5 illustrated in FIG. 13 is similar to the PoP structure PoP1 illustrated in FIG. 1L, hence the same reference numerals are used to refer to the same or liked parts, and its detailed description will be omitted herein.

As illustrated in FIG. 13, the insulating encapsulant 112' is omitted from the package-on-package structure PoP5. In some embodiments, the semiconductor die 110A is located within the insulating encapsulant 118' and surrounded by the first through insulator vias TV1 and the second through insulator vias TV2. In some embodiments, a semiconductor die 310 is disposed over the package structure PK1, and being electrically connected to the first through insulator vias TV1 and the second through insulator vias TV2 of the package structure PK1. In some embodiments, the semiconductor die 310 includes a semiconductor body 310A, an interconnection layer 310B located above the semiconductor body 310A, and connecting pads 310C located on opposing surfaces of the interconnection layer 310B for bonding the semiconductor die 310 to other structures. In some embodiments, the connecting pads 310C is electrically connected to conductive terminals 310D, wherein the semiconductor die 310 is bonded to the package structure PK1 through the conductive terminals 310D. In some embodiments, the semiconductor die 310 may be a memory die, including dynamic random access memory (DRAM) die, static random access memory (SRAM) die or a high bandwidth memory (HBM) die. Furthermore, in some embodiments, a passive device 124 (or integrated passive device) may be mounted on the redistribution layer 120, and being electrically connected to the redistribution layer 120 through the conductive pads 120C.

Figure 14:
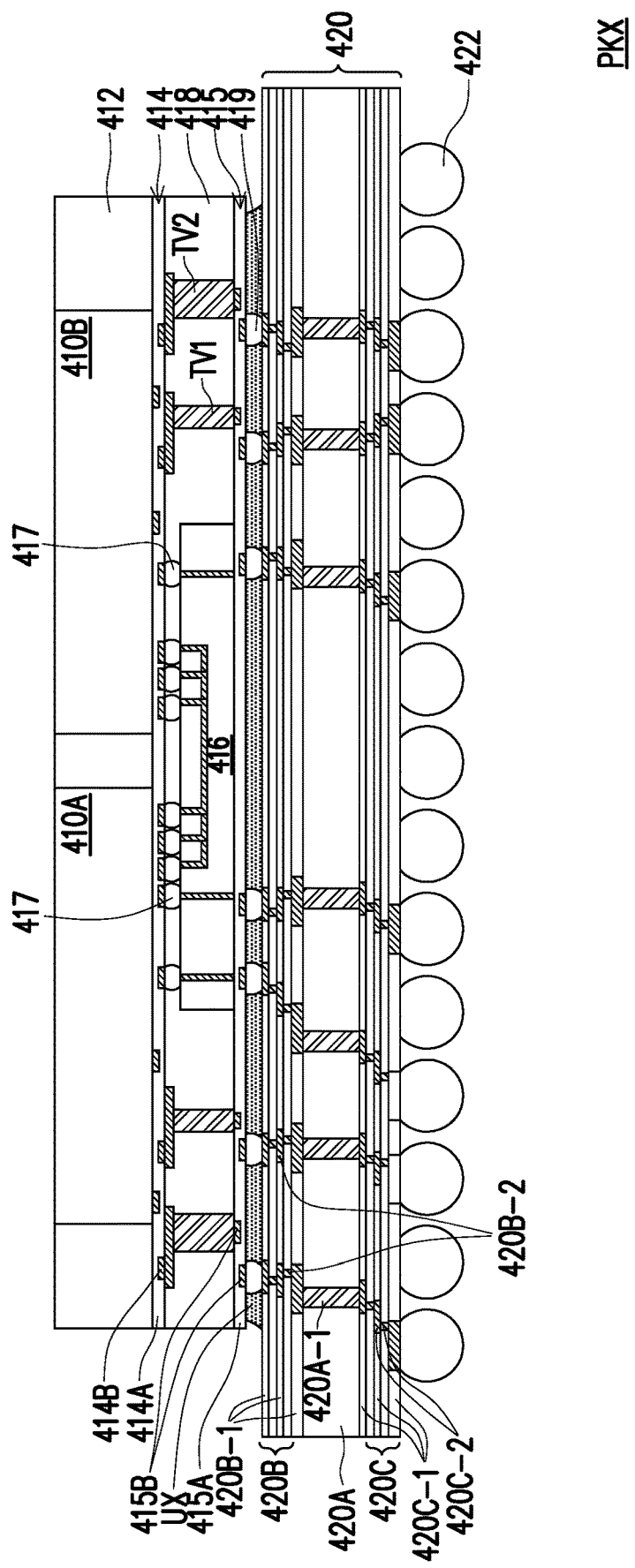
FIG. 14 is a schematic sectional view of a package structure according to some other exemplary embodiments of the present disclosure.

FIG. 14 is a schematic sectional view of a package structure according to some other exemplary embodiments of the present disclosure. As illustrated in FIG. 14, in some embodiments, the package structure PKX includes a first semiconductor die 410A and a second semiconductor die 410B embedded in an insulating encapsulant 412. The first semiconductor die 410A and the second semiconductor die 410B may be similar to the semiconductor dies 110A and 110B in the previous embodiments, hence its detailed description will be omitted herein. In some embodiments, the first semiconductor die 410A and the second semiconductor die 410B are bonded to or electrically connected to a redistribution layer 414. The redistribution layer 414 may include dielectric layers 414A and conductive layers 414B alternately stacked.

In some embodiments, a bridge structure 416 is electrically bonded to the redistribution layer 414 through a plurality of electrical connectors 417. Furthermore, the bridge structure 416 is electrically connected to the first semiconductor die 410A and the second semiconductor die 410B through the redistribution layer 414. In some embodiments, the bridge structure 416 includes a silicon bridge, which may be used for providing short inter-connection between the first semiconductor die 410A and the second semiconductor die 410B. In some embodiments, the bridge structure 416 is embedded in the insulating encapsulant 418 along with the first through insulator vias TV1 and the second through insulator vias TV2. In the exemplary embodiment, the first through insulator vias TV1 is located in a central area of the insulating encapsulant 418 to surround the bridge structure 416. Furthermore, in some embodiments, the second through insulator vias TV2 (having greater aspect ratio and size) is located in a peripheral area of the insulating encapsulant 418 to surround the first through insulator vias TV1.

In some embodiments, a redistribution layer 415 is further located over the insulating encapsulant 418 on a side opposite to the redistribution layer 414. For example, the redistribution layer 415 may include dielectric layers 415A and conductive layers 415B alternately stacked. In certain embodiments, the redistribution layer 415 is electrically connected to the redistribution layer 414 through the first through insulator vias TV1 and the second through insulator vias TV2. In some embodiments, a plurality of electrical connectors 419 is located over the redistribution layer 415 and being electrically connected to the redistribution layer 415. In some embodiments, the electrical connectors 419 are further bonded onto a circuit substrate 420, and being electrically connected thereto. In some embodiments, an underfill Ux is provided in between the redistribution layer 415 and the circuit substrate 420 to cover the electrical connectors 419. In certain embodiments, the underfill Ux fill up the spaces between the electrical connectors 419 to protect the electrical connectors 419.

As further illustrated in FIG. 14, in some embodiments, the circuit substrate 420 includes a substrate body 420A, and redistribution layers 420B and 420C located on two opposite sides of the substrate body 420A. In some embodiments, the substrate body 420A includes through vias 420A-1 for providing electrical connection between the redistribution layers 420B and 420C. In some embodiments, the redistribution layer 420B may include dielectric layers 420B-1 and conductive layers 420B-2 alternately stacked. In a similar way, the redistribution layer 420C may include dielectric layers 420C-1 and conductive layers 420C-2 alternately stacked. In some embodiments, the redistribution layer 420B is electrically connected to the electrical connectors 419 through the conductive layers 420B-2. In certain embodiments, a plurality of conductive terminals 422 is further disposed on the redistribution layer 420C, and being electrically connected to the conductive layers 420C-2.

In the above-mentioned embodiments, the package structure or package-on-package (PoP) structure includes at least a plurality of first through insulator vias (or first connecting vias) located in a central area of the insulating encapsulant, and a plurality of second through insulator vias (or second connecting vias) located at a peripheral area of the insulating encapsulant surrounding the first through insulator vias. Since the second through insulator vias (or second connecting vias) located at the peripheral area has a greater aspect ratio (or size) than that of the first through insulator vias (or first connecting vias), more structural integrity can be conferred to vias located in the peripheral area. As such, a via collapse issue usually observed in the periphery of the package structure may be resolved.

In accordance with some embodiments of the present disclosure, a package structure including a first semiconductor die, an insulating encapsulant, a plurality of first through insulator vias, a plurality of second through insulator vias, and a redistribution layer is provided. The insulating encapsulant is encapsulating the first semiconductor die. The first through insulator vias are located in a central area of the insulating encapsulant surrounding the first semiconductor die. The second through insulator vias are located in a peripheral area of the insulating encapsulant surrounding the plurality of first through insulator vias located in the central area, wherein an aspect ratio of the plurality of second through insulator vias is greater than an aspect ratio of the plurality of first through insulator vias. The redistribution layer is disposed on the insulating encapsulant and electrically connected to the first semiconductor die, the plurality of first through insulator vias and the plurality of second through insulator vias.

In accordance with some other embodiments of the present disclosure, a package-on-package structure including a first package and a second package is provided. The first package includes an insulating encapsulant, a plurality of first semiconductor dies, a plurality of first through insulator vias, a plurality of second through insulator vias. The first semiconductor dies are located in a first region and a second region of the insulating encapsulant. The first through insulator vias are located in the first region and the second region of the insulating encapsulant to surround the plurality of first semiconductor dies. The second through insulator vias are located in a third region of the insulating encapsulant at the peripheral of the first region and the second region, wherein a shape of the plurality of second through insulator vias is different than a shape of the plurality of first through insulator vias. The second package is stacked on the first package, wherein the second package is electrically connected to the plurality of first through insulator vias and the plurality of second through insulator vias through a plurality of electrical connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
  a first semiconductor die;
  an insulating encapsulant encapsulating the first semiconductor die;
  a plurality of first through insulator vias located in a central area of the insulating encapsulant surrounding the first semiconductor die;
  a plurality of second through insulator vias located in a peripheral area of the insulating encapsulant surrounding the plurality of first through insulator vias located in the central area, wherein an aspect ratio of the plurality of second through insulator vias is greater than an aspect ratio of the plurality of first through insulator vias;
  a plurality of third through insulator vias located at four corners in the peripheral area of the insulating encapsulant, wherein a size of the plurality of third through insulator vias is greater than a size of the plurality of first through insulator vias and a size of the plurality of second through insulator vias; and
  a redistribution layer disposed on the insulating encapsulant and electrically connected to the first semiconductor die, the plurality of first through insulator vias and the plurality of second through insulator vias.

2. The package structure according to claim 1, further comprising:
  a second semiconductor die located below the first semiconductor die;
  a second insulating encapsulant located below the insulating encapsulant and encapsulating the second semiconductor die; and
  a plurality of connecting vias located in the second insulating encapsulant surrounding the second semiconductor die, and electrically connected to the plurality of first through insulator vias and the plurality of second through insulator vias.

3. The package structure according to claim 2, wherein a size of the plurality of connecting vias is greater than a size of the plurality of first through insulator vias and the plurality of second through insulator vias.

4. The package structure according to claim 1, further comprising:
  a second semiconductor die located below the first semiconductor die;
  a second insulating encapsulant located below the insulating encapsulant and encapsulating the second semiconductor die;
  a plurality of first connecting vias located in a central area of the second insulating encapsulant and electrically connected to the plurality of first through insulator vias, wherein a size of the plurality of first connecting vias is greater than a size of the plurality of first through insulator vias; and
  a plurality of second connecting vias located in a peripheral area of the second insulating encapsulant surrounding the plurality of first connecting vias located in the central area and electrically connected to the plurality of second through insulator vias, wherein a size of the plurality of second connecting vias is greater than a size of the plurality of second through insulator vias.

5. The package structure according to claim 1, wherein the aspect ratio of the plurality of first through insulator vias is 1:1, and the aspect ratio of the plurality of second through insulator vias is in a range of 1.1:1 to 3:1.

6. The package structure according to claim 1, wherein the plurality of first through insulator vias has a circular shape from a top view, and the plurality of second through insulator vias has an oval shape or rectangular shape from the top view.

7. A package-on-package structure, comprising:
  a first package, comprising:
    an insulating encapsulant;
    a plurality of first semiconductor dies located in a first region and a second region of the insulating encapsulant;
    a plurality of first through insulator vias located in the first region and the second region of the insulating encapsulant to surround the plurality of first semiconductor dies;
    a plurality of second through insulator vias located in a third region of the insulating encapsulant at the peripheral of the first region and the second region, wherein a shape of the plurality of second through insulator vias is different than a shape of the plurality of first through insulator vias; and
    wherein the insulating encapsulant further comprises a fourth region surrounded by the third region and located in between the first region and the second region, and the plurality of second through insulator vias is further located in the fourth region; and
  a second package stacked on the first package, wherein the second package is electrically connected to the plurality of first through insulator vias and the plurality of second through insulator vias through a plurality of electrical connectors.

8. The package-on-package structure according to claim 7, wherein the plurality of first through insulator vias has a circular shape from a top view, and the plurality of second through insulator vias has an oval shape or a rectangular shape from the top view.

9. The package-on-package structure according to claim 7, further comprising:
  a second insulating encapsulant located in the first package between the insulating encapsulant and the second package;
  a plurality of second semiconductor dies located in the second insulating encapsulant below the plurality of first semiconductor dies in the first region and the second region; and
  a plurality of connecting vias located in the second insulating encapsulant surrounding the plurality of second semiconductor dies, and electrically connected to the plurality of first through insulator vias and the plurality of second through insulator vias.

10. The package-on-package structure according to claim 9, wherein a size of the plurality of connecting vias is greater than a size of the plurality of first through insulator vias and the plurality of second through insulator vias.

11. The package-on-package structure according to claim 7, further comprising
   a second insulating encapsulant located in the first package between the insulating encapsulant and the second package;
   a plurality of second semiconductor dies located in the second insulating encapsulant below the plurality of first semiconductor dies in the first region and the second region; and
   a plurality of first connecting vias located in the second insulating encapsulant and electrically connected to the plurality of first through insulator vias, wherein a size of the plurality of first connecting vias is greater than a size of the plurality of first through insulator vias; and
   a plurality of second connecting vias located in the second insulating encapsulant surrounding the plurality of first connecting vias and electrically connected to the plurality of second through insulator vias, wherein a size of the plurality of second connecting vias is greater than a size of the plurality of second through insulator vias.

12. The package-on-package structure according to claim 7, further comprising a plurality of third through insulator vias located at four corners in the third region of the insulating encapsulant, wherein a size of the plurality of third through insulator vias is greater than a size of the plurality of first through insulator vias and a size of the plurality of second through insulator vias.

13. A method of fabricating a package structure, comprising:
   providing a first semiconductor die on a carrier;
   forming a plurality of first through insulator vias surrounding the first semiconductor die, and forming a plurality of second through insulator vias surrounding the plurality of first through insulator vias, wherein an aspect ratio of the plurality of second through insulator vias is greater than an aspect ratio of the plurality of first through insulator vias;
   forming a plurality of third through insulator aside the plurality of second through insulator vias, wherein a size of the plurality of third through insulator vias is greater than a size of the plurality of first through insulator vias and a size of the plurality of second through insulator vias;
   forming an insulating encapsulant encapsulating the plurality of first through insulator vias and the plurality of second through insulator vias, so that the plurality of first through insulator vias is located in a central area of the insulating encapsulant, the plurality of second through insulator vias is located in a peripheral area of the insulating encapsulant surrounding the central area, and the plurality of third through insulator vias is located at four corners in the peripheral area of the insulating encapsulant;
   forming a redistribution layer on the insulating encapsulant, wherein the redistribution layer is electrically connected to the first semiconductor die, the plurality of first through insulator vias and the plurality of second through insulator vias; and
   debonding the carrier.

14. The method of fabricating a package structure according to claim 13, wherein prior to providing the first semiconductor die on the carrier, the method further comprises:
   providing a second semiconductor die on the carrier;
   forming a second insulating encapsulant encapsulating the second semiconductor die; and
   forming a plurality of connecting vias within the second insulating encapsulant to surround the second semiconductor die,
   wherein the first semiconductor die is formed on the second semiconductor die, the insulating encapsulant is formed on the second insulating encapsulant, and the plurality of first through insulator vias and the plurality of second through insulator vias is formed to be electrically connected to the plurality of connecting vias.

15. The method of fabricating a package structure according to claim 14, wherein the plurality of connecting vias is formed with a size greater than that of the plurality of first through insulator vias and the plurality of second through insulator vias.

16. The method of fabricating a package structure according to claim 13, wherein the aspect ratio of the plurality of first through insulator vias is 1:1, and the aspect ratio of the plurality of second through insulator vias is in a range of 1.1:1 to 3:1.

17. The package structure according to claim 1, wherein the plurality of third through insulator vias has a square shape with rounded corners from a top view, or the plurality of third through insulator vias has a circular shape from the top view.

18. The package structure according to claim 1, further comprising:
   a second semiconductor die embedded in the insulating encapsulant aside the first semiconductor die, wherein the plurality of first through insulator vias is surrounding the first semiconductor die and the second semiconductor die.

19. The package-on-package structure according to claim 7, further comprising:
   a redistribution layer disposed on the insulating encapsulant and electrically connected to the plurality of first semiconductor dies, the plurality of first through insulator vias and the plurality of second through insulator vias; and
   a plurality of conductive balls disposed on the redistribution layer.

20. The package-on-package structure according to claim 19, further comprising:
   a second redistribution layer disposed in between the insulating encapsulant and the second package, wherein the second redistribution layer is electrically connected to the plurality of first through insulator vias and the plurality of second through insulator vias.

* * * * *